US009207276B2

United States Patent
Bieck

(10) Patent No.: US 9,207,276 B2
(45) Date of Patent: Dec. 8, 2015

(54) METHOD AND APPARATUS FOR TESTING A SEMICONDUCTOR WAFER

(75) Inventor: Florian Bieck, Schaumburg (DE)

(73) Assignee: DISCO CORPORATION, Tokyo (JP)

( * ) Notice: Subject to any disclaimer, the term of this patent is extended or adjusted under 35 U.S.C. 154(b) by 813 days.

(21) Appl. No.: 13/145,109

(22) PCT Filed: Nov. 26, 2009

(86) PCT No.: PCT/IB2009/055351
§ 371 (c)(1),
(2), (4) Date: Jan. 5, 2012

(87) PCT Pub. No.: WO2010/082094
PCT Pub. Date: Jul. 22, 2010

(65) Prior Publication Data
US 2012/0299610 A1    Nov. 29, 2012

(30) Foreign Application Priority Data

| Jan. 17, 2009 | (WO) | PCT/IB2009/050166 |
| Jan. 22, 2009 | (WO) | PCT/IB2009/050231 |
| May 23, 2009 | (WO) | PCT/IB2009/052163 |
| May 28, 2009 | (SG) | 200903640 |
| Jul. 10, 2009 | (SG) | 200904721 |
| Oct. 16, 2009 | (SG) | 200906937 |

(51) Int. Cl.
*G01R 31/20*  (2006.01)
*G01R 31/28*  (2006.01)

(52) U.S. Cl.
CPC .................. *G01R 31/2887* (2013.01)

(58) Field of Classification Search
None
See application file for complete search history.

(56) References Cited

U.S. PATENT DOCUMENTS

| 6,677,773 B2 * | 1/2004 | Prokopp .................. 324/750.25 |
| 6,747,464 B1 | 6/2004 | Blackwood |
| 7,348,786 B2 | 3/2008 | Thacker et al. |
| 7,598,523 B2 | 10/2009 | Luo et al. |
| 2002/0075023 A1 * | 6/2002 | Pierce ........................... 324/758 |
| 2006/0292826 A1 | 12/2006 | Kajiyama et al. |
| 2007/0296423 A1 | 12/2007 | Whitener |
| 2008/0079121 A1 | 4/2008 | Han |
| 2008/0090505 A1 | 4/2008 | Yoshida et al. |
| 2008/0141955 A1 | 6/2008 | Young |

OTHER PUBLICATIONS

Taiwan Intellectual Property Office Examination Report for Taiwan Patent Application No. 098140501 dated Dec. 31, 2013 (language: Traditional Chinese).

(Continued)

*Primary Examiner* — Paresh Patel
(74) *Attorney, Agent, or Firm* — George Dacai Liu

(57) ABSTRACT

A method for testing a semiconductor wafer comprises providing a semiconductor wafer. The semiconductor wafer comprises a protruding annular rim, a first redistribution structure disposed on the front side of the semiconductor wafer, a second redistribution structure disposed on the rear side of the semiconductor wafer within the protruding annular rim and a plurality of vias extending from the front side to the rear side. A first probe is contacted to the first redistribution structure on the front side and a second probe is contacted to the second redistribution structure on the rear side. The first probe is in contact with the first redistribution structure and the second probe is in contact with the second redistribution structure at the same time.

20 Claims, 21 Drawing Sheets

(56) References Cited

OTHER PUBLICATIONS

Figure 1:
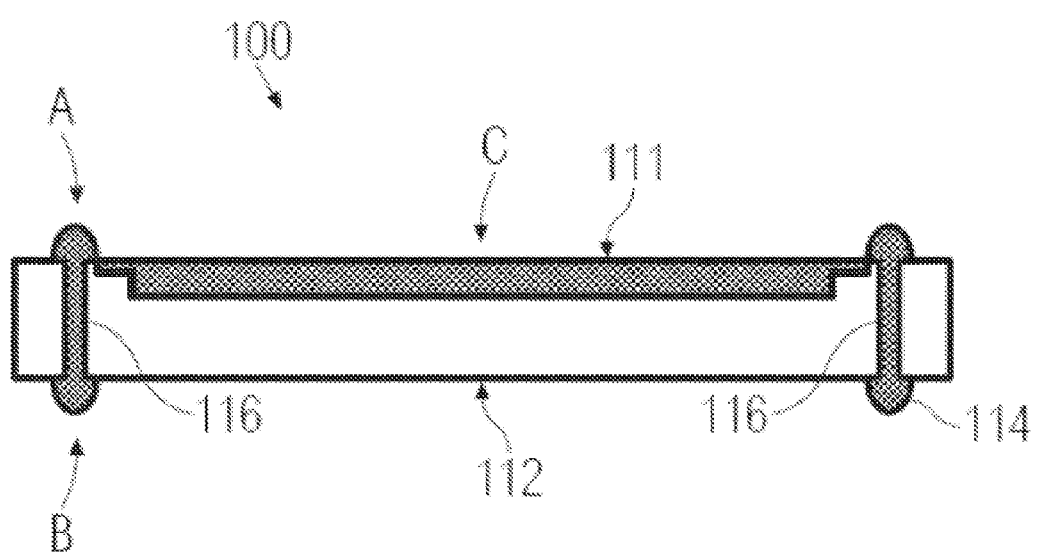

English Translation of Taiwan Intellectual Property Office Examination Report for Taiwan Patent Application No. 098140501 dated Dec. 31, 2013.
Probe Card Tutorial; Otto Weeden, Keithley Instruments, Inc.; Copyright 2003, 28775 Aurora Road, Cleveland, OH 44139, U.S.A.
Semprex—Manufacturer of Probe Needles—Online Catalog (http://www.semprex.com/products/probe.html); Semprex Corporation; Copyright 1966-2009; 782 Camden Avenue, Campbell, CA 95008, U.S.A., (two pages).
OA from Taiwan patent office for the corresponding application in Taiwan (English translation), Sep. 12, 2014.
OA from Taiwan patent office for the corresponding application in Taiwan (Chinese original), Sep. 2, 2014.

* cited by examiner

METHOD AND APPARATUS FOR TESTING A SEMICONDUCTOR WAFER

The present application relates to a method and apparatus for testing a semiconductor wafer, in particular a semiconductor wafer having a thin central portion and an annular protruding rim.

Increasing miniaturization of semiconductor components is generally desirable. Increased miniaturization can be achieved by increasing the integration density of the integrated circuits within the semiconductor substrate. This can lead to a reduction in the area occupied by the semiconductor substrate. Additional miniaturization can be achieved by reducing the thickness of the semiconductor substrate. The thickness may be reduced by removing material from the rear side of the semiconductor substrate after the integrated circuits have been formed in the opposing front side of semiconductor substrate.

U.S. Pat. No. 7,278,903 and US 2008/0090505 A1 disclose a method of producing a semiconductor wafer with a thin central portion and an annular protruding rim. A generally circular thinned central portion is formed in an area of a rear surface of a standard wafer by grinding the central portion of the rear side of the wafer. An annular rim is concurrently formed around said thinned central portion, which protrudes from the rear side of the wafer in the peripheral rim region of the wafer that is not subjected to the grinding process. The rear side of the wafer can be considered to have a circular recess. The annular rim may also be denoted as a reinforcing rib region that is thicker than the inside region of the wafer. This annular protruding portion serves as a reinforcing portion to improve the rigidity of the wafer as a whole.

However, further improvements resulting in a further miniaturisation of devices and/or increase in device density are desirable.

The application provides a method and apparatus for testing a semiconductor wafer and, in particular, a method and apparatus for testing a semiconductor wafer with an annular protruding rim.

A method for testing a semiconductor wafer is provided. The method comprises providing a semiconductor wafer comprising a protruding annular rim, a first redistribution structure disposed on the front side of the semiconductor wafer, a second redistribution structure disposed on the rear side of the semiconductor wafer within the protruding annular rim and a plurality of vias extending from the front side to the rear side. A first probe is contacted to the first redistribution structure on the front side, and a second probe is contacted to the second redistribution structure on the rear side. The first probe is in contact with the first redistribution structure and the second probe is in contact with the second redistribution structure at the same time.

This method enables the wafer to be tested from both sides at the same time. This enables the electrical characteristics of the vias to be tested by placing a probe at the two opposing ends of the via. The via may be electrically conductive due to an electrically conductive covering on the side walls of the via. The via may be in addition or alternatively be filled with electrically conductive material to form an electrically conductive via. The via may also be electrically connected to one or more bonding pads positioned on the front side or the rear side of the semiconductor chip. In this case, the first probe and second probe may contact these contact pads in order to test the electrical functionality of the via.

A via is also called a through silicon via (TSV).

The terms rear side, rear side, and passive side are used interchangeably throughout the specification to denote the same side of the wafer or the chip.

Front side and active side are used interchangeably throughout the specification to denote the same side of the wafer. The front side opposes the rear side.

First probe and second probe is used to describe a probe with one needle or a plurality of needles that is/are brought into contact with an object such as a contact pad that is electrically connected to the object to be tested such as a via, integrated circuit structure or test structure.

The method is used to test a wafer having a protruding annular rim, which acts as a reinforcing structure. This protruding annular rim may protrude from the rear side of the wafer. The protruding annular rim of the wafer defines a recessed portion, the recessed portion having a thickness of less than 100 µm or less than 60 µm. In special cases, this thickness can even be about 15 µm. The recessed portion may be circular and concentric with the outermost side face of the wafer.

The protruding annular rim has a width and, in an embodiment, comprises a plurality of slits or slots extending generally radially across the entire width of the rim. These slits may also be described as slits or perforations and serve to allow fluid present within the recessed portion to exit the recessed portion when the wafer is subjected to centrifugal force. These slits enable fluid used during wet grinding of the rear side to create the recess and protruding annular rim to escape from the recess and thus improve grinding speed and quality of the finish achieved by the wet-grinding process.

In an embodiment, the method further comprises retaining the protruding annular rim between a first retaining member and a second retaining member. This may be performed before testing the wafer in order that the position of the wafer remains unaltered during testing.

In an embodiment, the protruding annular rim is retained so that the first redistribution structure remains accesBible within the first retaining member and the second redistribution structure and the second retaining member remains accessible within the first retaining member. This enables the wafer to be tested from both sides at the same time by contacting a probe on the two opposing sides of the wafer simultaneously. This method may be used to test the electrical functionality of the vias extending between opposing sides of the wafer.

The method may also further comprise activating a signal source to apply or receive electrical or electromagnetic energy via the first probe to and/or from the first redistribution structure. The electromagnetic energy can carry light.

This embodiment may be used to test structures only contactable via the first distribution structure if the signal source is activated to apply and receive electrical or electromagnetic energy via the first probe and via the first redistribution structure. This embodiment may also be used to apply electrical or electromagnetic energy via the first probe to the first redistribution structure, which is received by the second probe in contact with the second redistribution structure and vice versa.

The method may also further comprise activating a signal source to apply or receive electrical or electromagnetic energy via the second probe to and/or from the second redistribution structure.

As mentioned above, the method may be used to test electrically conductive vias that extend between the front and rear side of the wafer and that may extend generally perpendicularly to the front side and rear side of the wafer. The method may further comprise activating a signal source to apply an electrical or electromagnetic energy via the first probe to the first redistribution structure on the front side and determining if the electrical or electromagnetic energy is transferred to the second redistribution structure on the rear side via the second probe contacting the second redistribution structure.

If the signal is transferred from the first probe to the second probe the via can be marked as functional or defective. The signal can also be analysed in more detail to determine if the received signal has a desired form or value in order to mark the via as functional or defective.

The previous embodiment may also be performed in reverse so the signal source is activated to apply an electrical or electromagnetic energy via the second probe to the second redistribution structure and to determine if the electrical or electromagnetic energy is transferred to the first redistribution structure by the first probe contacting the first redistribution structure.

In a further embodiment, the first probe is applied to a bond pad of the first redistribution structure that is associated with an electrically conductive via extending from the front side to the rear side of the semiconductor wafer. The second probe is applied to a bond pad of the second redistribution structure that is associated with the same electrically conductive via. An electrical signal is then applied to one or more of the bond pads to determine the characteristics of the electrical path between the bond pads. Depending on the measured characteristics and the predetermined threshold characteristics determining functioning and non-functioning, the via can be marked as functional or defective.

At least a part of the second probe is positioned within the protruding annular rim of whilst contacting the second redistribution structure since the rear side of the wafer and the second redistribution structure is positioned at a lower height that that of the uppermost surface of the protruding rim.

In further embodiments, two or more dies within the wafer are tested in one testing run. All of the dies within the wafer may be tested in one run to obtain a wafer map identifying the good dies that is dies, which fulfil the predetermined desired characteristics and bad dies, that is die which do not fulfil predetermined desired characteristics.

The semiconductor wafer may be moved relative to the first probe and relative to the second probe the width of a die configured on the semiconductor wafer from this die to each of all neighbouring die across the entire wafer in a step and repeat fashion. The movement of the wafer may only take place during an interim between contacting the first probe to the redistribution structure on the front side, and contacting a second probe to the redistribution structure on the rear side, whilst the first probe is in contact with the first redistribution structure on the front side. In this embodiment, the first and second probe holders may remain stationary in the x-y directions and the wafer is moved in the x-y directions. The needles and possibly the probe unit are moved in the z-direction so as to contact the wafer for a test and then move away from the wafer surfaces so as to enable the wafer to be moved to the adjacent die.

Alternatively, the wafer may be held stationary and the first and second probes moved relative to the wafer. In this embodiment, the first probe and the second probe are moved relative to the semiconductor wafer the width of a die configured on the wafer from the die to each of all neighbouring die across the entire wafer in a step and repeat fashion only during an interim between contacting the first probe to the first redistribution structure on the front side, and contacting the second probe to the second redistribution structure on the rear side, whilst the first probe is in contact with the first redistribution structure on the front side.

A portion of the wafer that comprises the first redistribution structure on the front side and the second redistribution structure on the rear side can be clamped by cups such that the portion is essentially rigid. This allows easier or better alignment of the probe tips to the bond or contact pads. The cups are adapted such that they do not leave scratch marks on surfaces of the wafer.

The application also provides apparatus for testing a semiconductor wafer. The apparatus comprises a first probe positionable adjacent to a first major surface of the wafer and a second probe positionable adjacent to a second major surface of the wafer, the first major surface opposing the second major surface. The first probe and the second probe are movable in x, y and z directions with respect to the wafer or the wafer is movable in x, y and z directions with respect to the first probe and the second probe. The apparatus also comprises a first retaining member and a second retaining member, the first and second retaining member being mutually co-operable to retain the semiconductor wafer. At least one electrical signal source for applying an electrical signal to the first major surface and/or second major surface of the semiconductor wafer, and at least one electrical signal measurement device are provided.

This apparatus can be used to electrically test the wafer from both sides and electrically test the wafer from both sides simultaneously.

In an embodiment, the first probe comprises a first plurality of probe needles for sending and/or receiving electrical test signals and the second probe comprises a second plurality of probe needles for sending and/or receiving electrical test signals. Each probe and the needles can be configures to test a single die of a semiconductor wafer.

This enables structures only on the first side, structures only on the second side and structures extending between the first and side sides to be tested by applying signals to the wafer via different combinations of needies of one or both of the probes whilst the probe remains in contact with the wafer. This reduces the numbers of times that the probe has to be brought into contact with the wafer and may reduce the time required to test the wafer.

The first and second retaining members may have a variety of forms. In an embodiment, the first retaining member comprises a first annular ring. The first annular ring may be dimensioned to align with the protruding annular rim of the semiconductor wafer.

The second retaining member may comprise a second annular ring with a protruding peripheral rim, the second annular ring being dimensioned so that an outer face of the protruding annular rim of the semiconductor wafer is accommodated within the protruding peripheral rim.

These two embodiments may used together in the apparatus of one of the previously described embodiments to support the wafer during testing.

In a further embodiment, the first annular ring further comprises a protruding peripheral rim, the first annular ring being dimensioned so that an outer face of the protruding annular rim of the semiconductor wafer is accommodated within the protruding peripheral rim. This first retaining ring may be used with a second retaining ring that comprises a second annular ring with a protruding peripheral rim, the second annular ring being dimensioned so that an outer face of the protruding annular rim of the semiconductor wafer is accommodated within the protruding peripheral rim.

In a further embodiment, the second annular ring comprises a rim protruding from an inner region of the ring. The outer face of the protruding rim is dimensioned such that it can be accommodated within an inner face of the protruding annular rim of the semiconductor wafer.

The apparatus may further comprise means to exert compressive stress on the semiconductor wafer by means of the first retaining member and the second retaining member, the first retaining member and the second retaining member being positioned on opposing sides of the semiconductor wafer. The compressive stress secures the wafer within the first and second retaining members.

The first probe can comprise a first clamping rim whilst the second probe can comprise a second clamping rim. In a testing position, the second clamping rim is positioned opposite to or facing the first clamping rim. The first clamping rim surrounds tips of the first plurality of probe needles whilst the second surrounds tips of the second plurality of probe needles. In other words, the first and second clamping rims surround the area of the wafer that is undergoing electrical testing. The first clamping rim and second clamping rim can be operated to clamp a portion of the semiconductor such that the portion is essentially rigid for testing.

The application also relates to the use of the apparatus according to one of the embodiments described above to test electrically a semiconductor wafer. The semiconductor wafer comprises a protruding annular rim, a first redistribution structure disposed on the front side of the semiconductor wafer, a second redistribution structure disposed on the rear side of the semiconductor wafer within the protruding annular rim and a plurality of vias extending from the front side to the rear side.

The semiconductor wafer may comprise a plurality of dies arranged in a square grid array. One or more of the dies may include a plurality of vias. These vias may be electrically conductive due to an electrically conductive coating on the side walls of a though-hole or due to the through-hole being filled with electrically conducive material for example.

The protruding annular rim, which is integral with the wafer defines a recessed portion in the rear side of the wafer. The recessed portion has a base having a thickness of less than 100 μm or less than 60 μm and side walls formed from the protruding annular rim. In special implementations, the thickness can be about 15 μm or more than about 10 μm.

The protruding annular rim may have a thickness of around 700 μm, which corresponds to the thickness of the wafer before processing of the rear side has begun.

The protruding annular rim also has a width and, in a further embodiment, comprises a plurality of slits extending generally radially across the entire width of the rim. The slits can also be described as channels, grooves, or slots.

The plurality of slits is configured for a fluid flow between an inner face of the protruding annular rim towards an outer face of the protruding annular rim. The plurality of slits may incline upwardly away from the recessed portion towards the outer face.

Embodiments will now be described with reference to the accompanying drawings.

Figure 2:
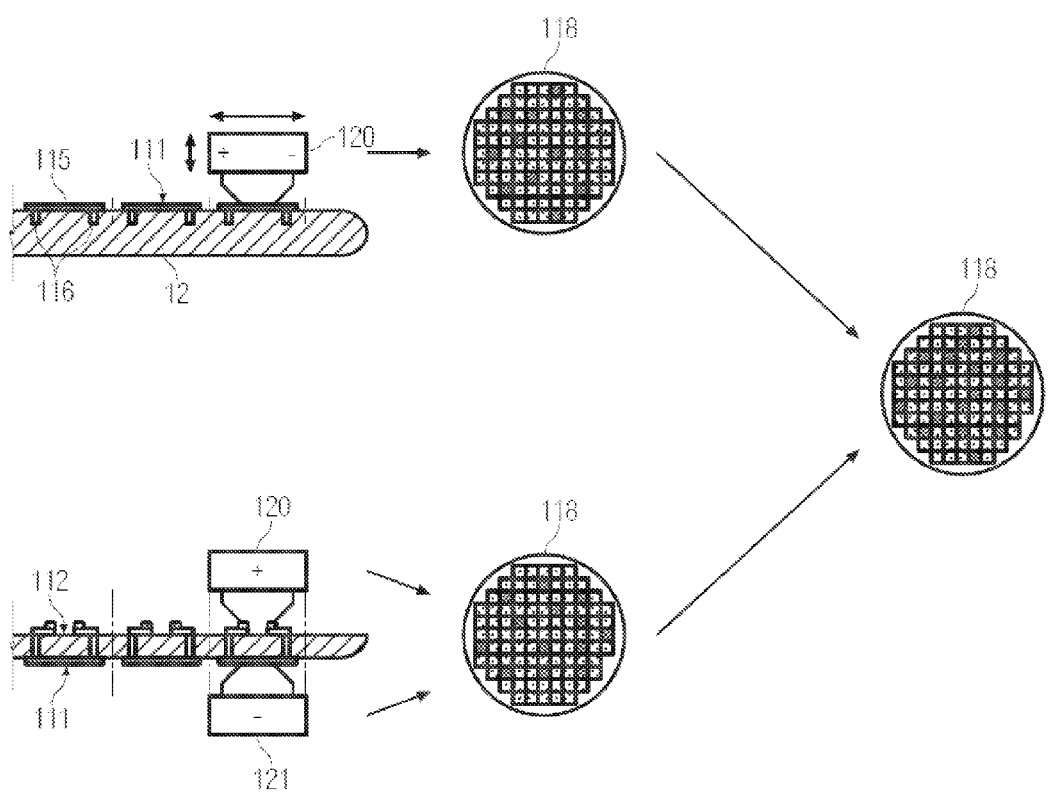
Figure 3:
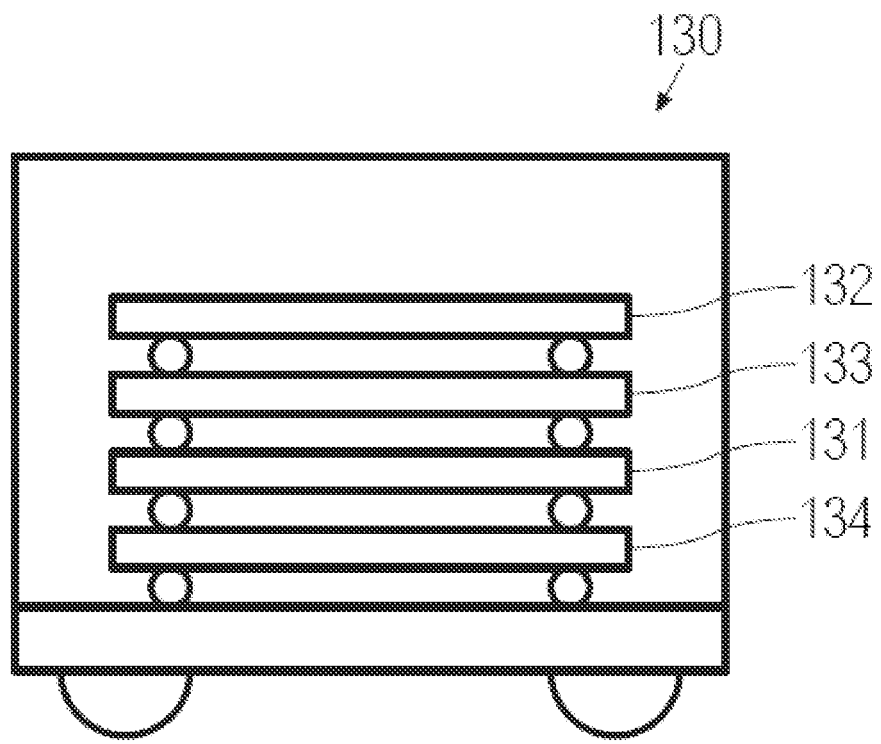
Figure 4:
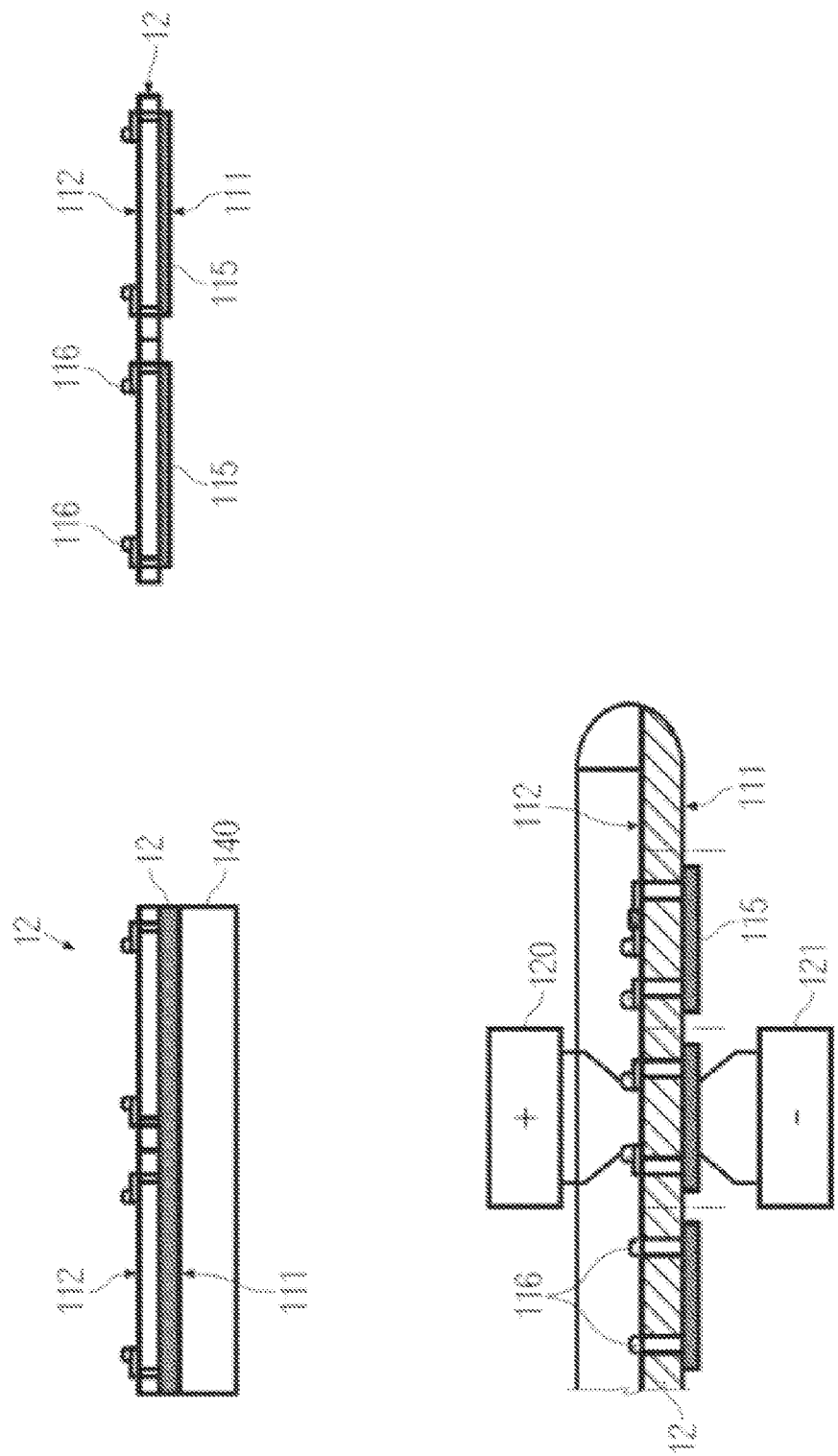
Figure 5:
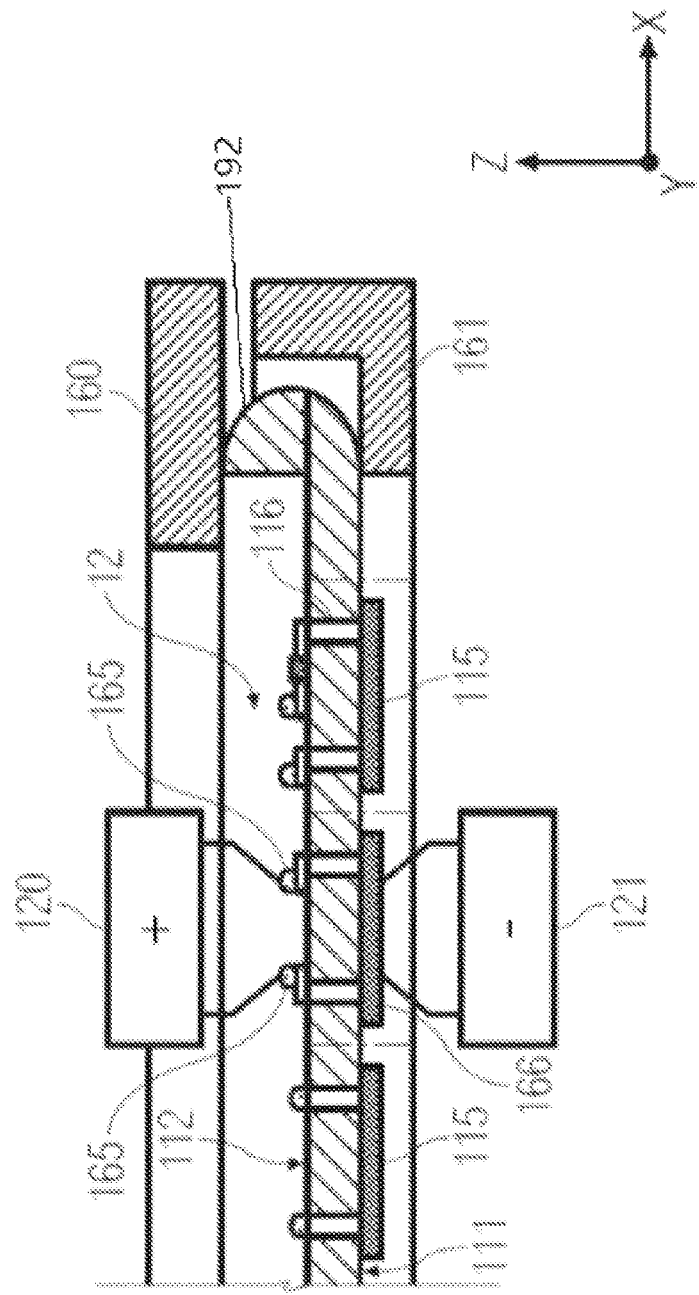

FIG. 1 illustrates a semiconductor chip having a through contact;
FIG. 2 illustrates testing methods for a wafer comprising a plurality of semiconductor chips as illustrated in FIG. 1;
FIG. 3 illustrates a stack of semiconductor chips;
FIG. 4 illustrates a method for testing a wafer including retaining means for retraining the wafer;
FIG. 5 illustrates retaining means suitable for use in the testing method illustrated in FIG. 2.

Figure 6:
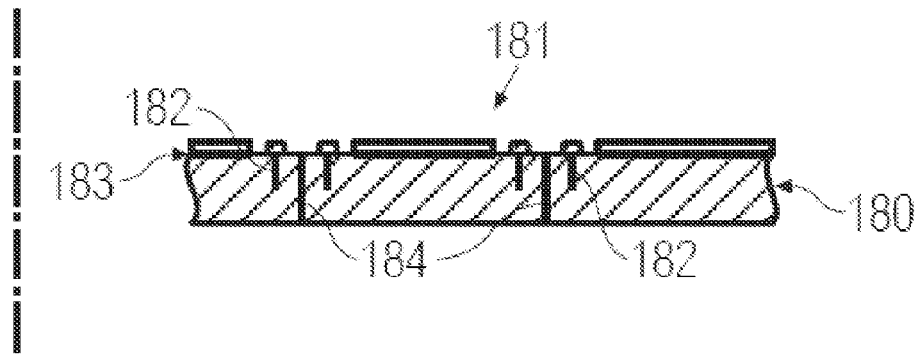
Figure 7:
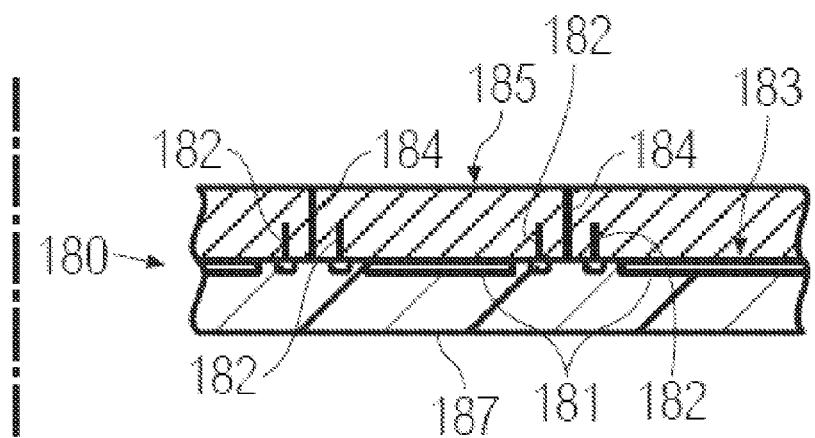
Figure 8A:
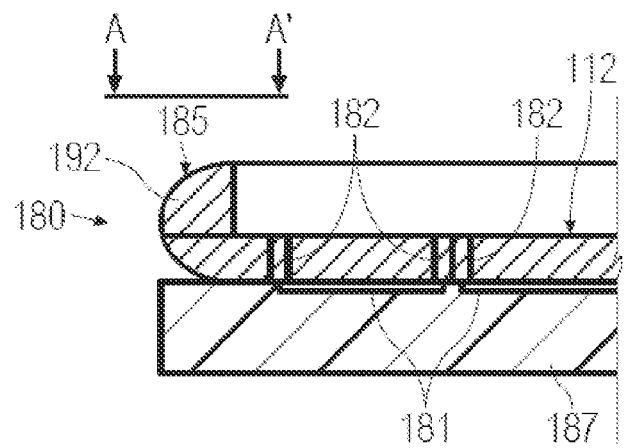
Figure 8B:
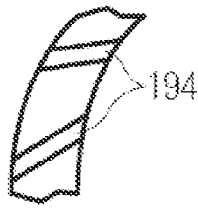
Figure 9:
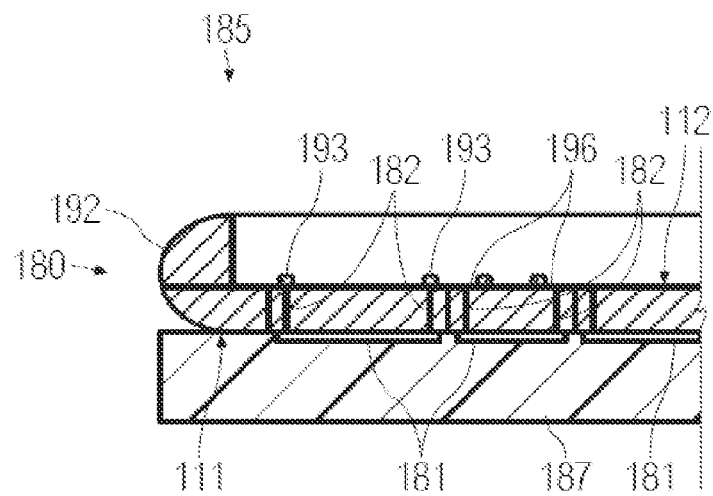
Figure 10:
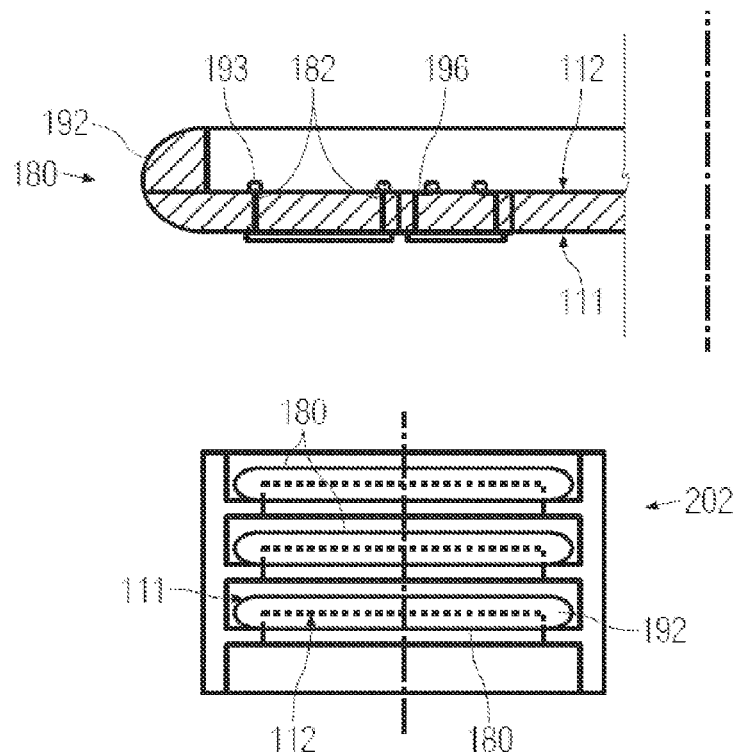
Figure 11:
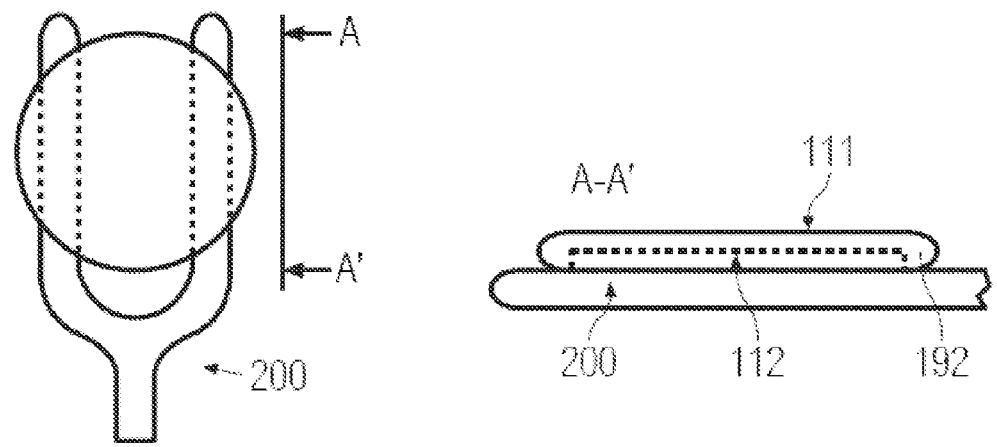
Figure 12:
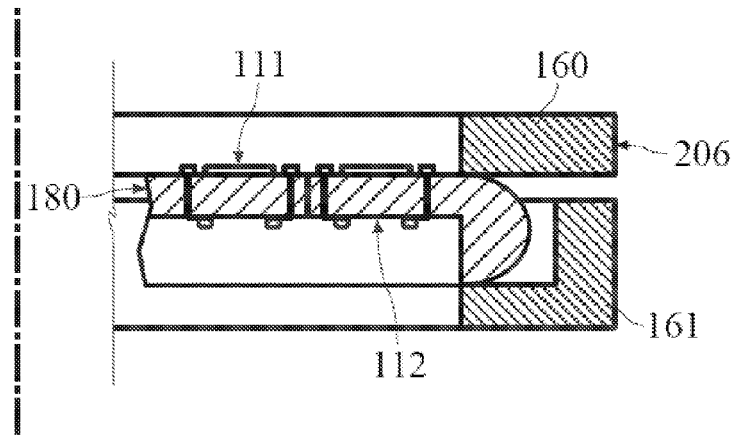
Figure 13:
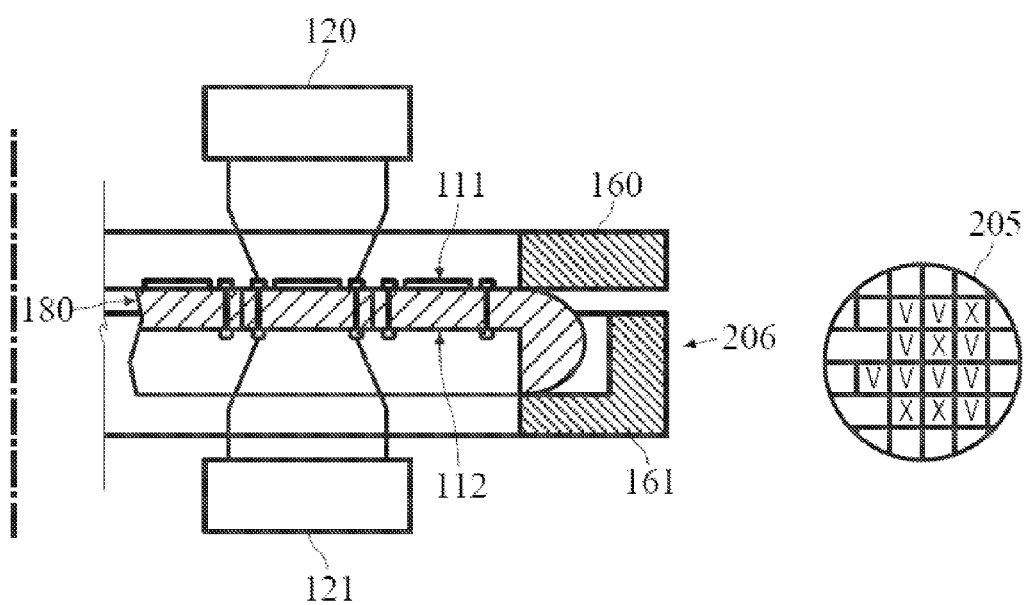
Figure 14:
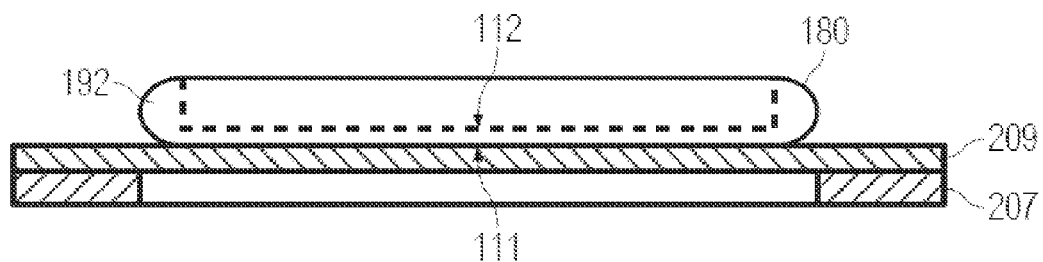
Figure 15:
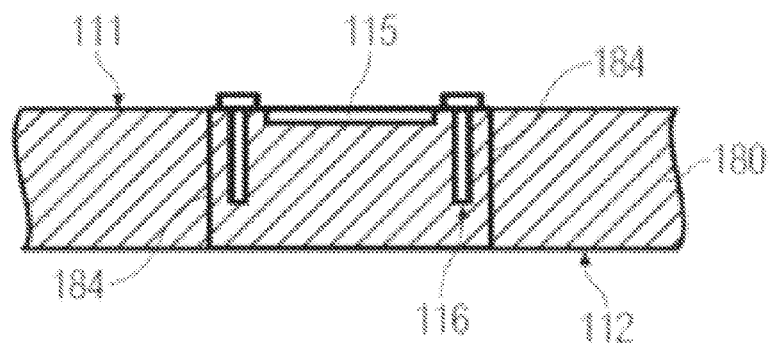
Figure 16:
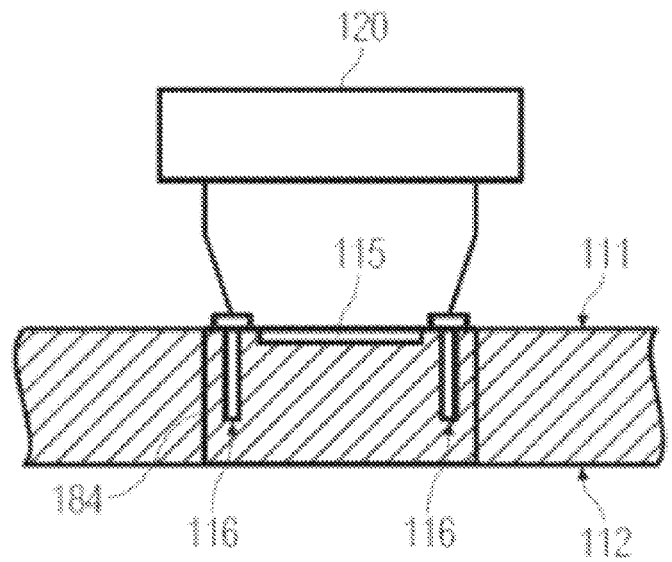
Figure 17:
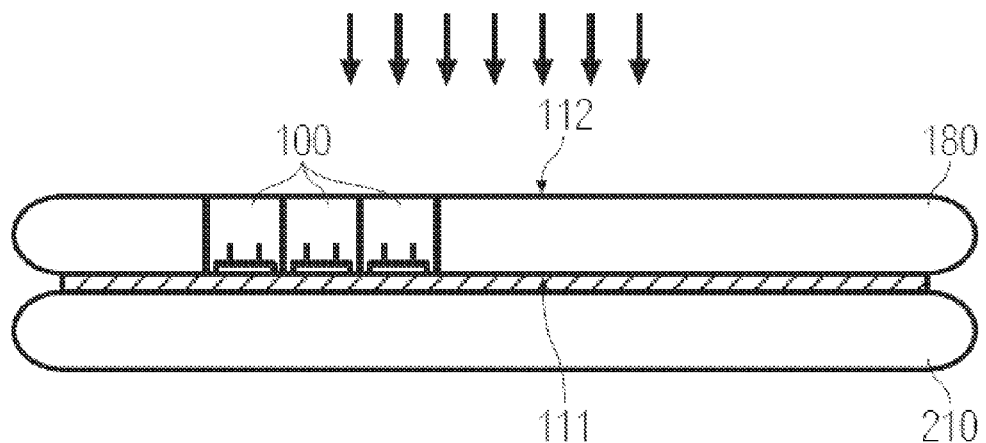
Figure 18:
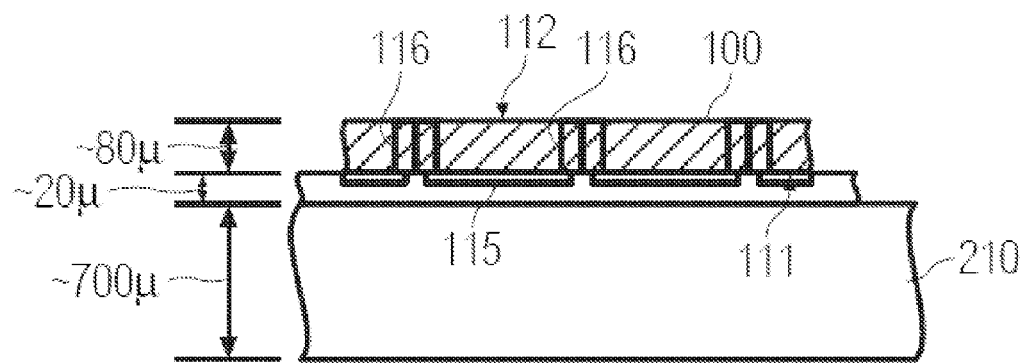
Figure 19:
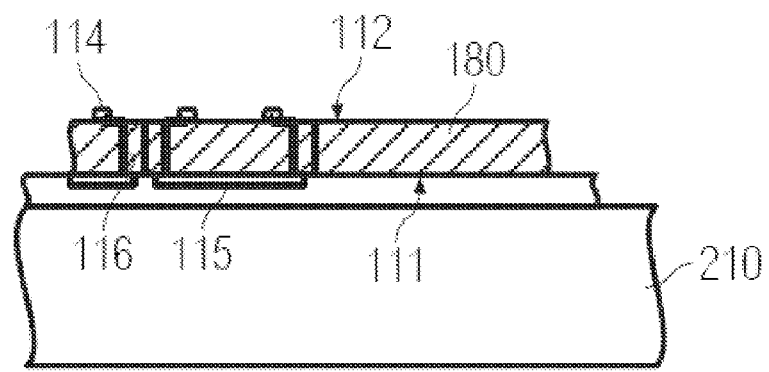
Figure 20:
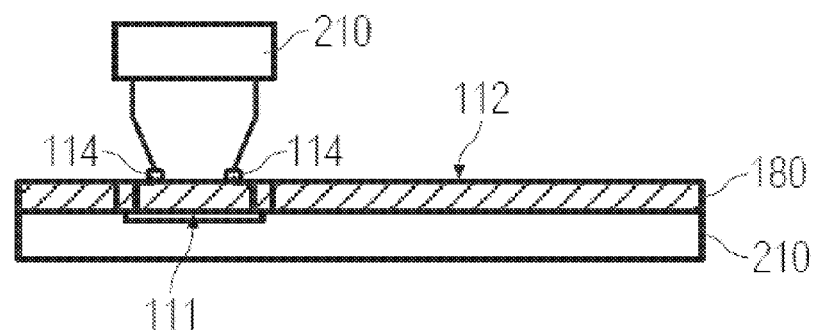
Figure 21:
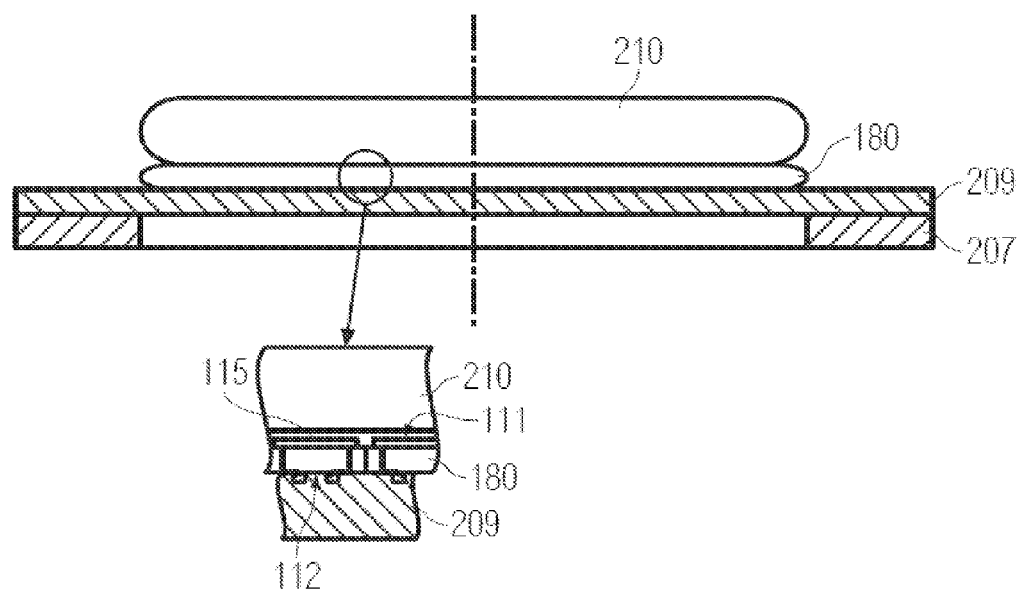
Figure 22:
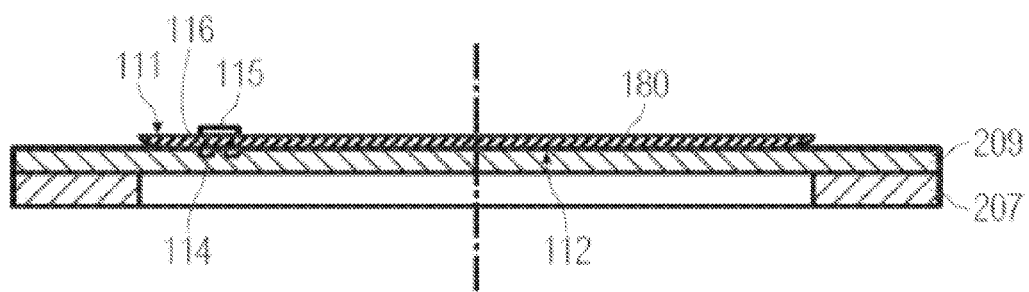
Figure 23:
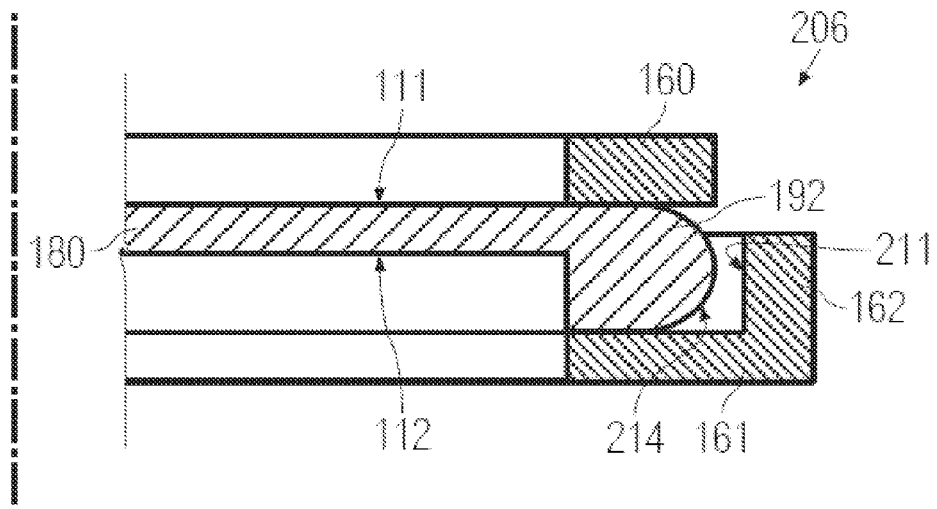
Figure 24:
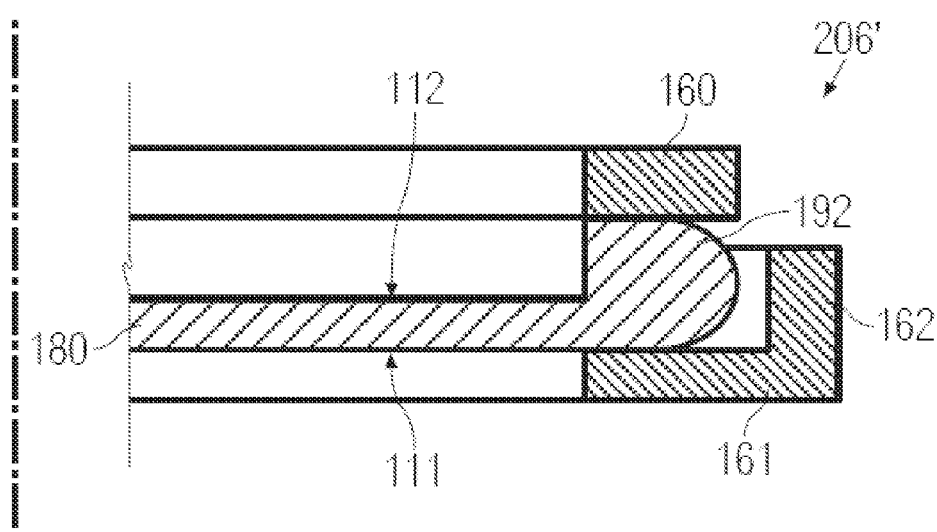
Figure 25:
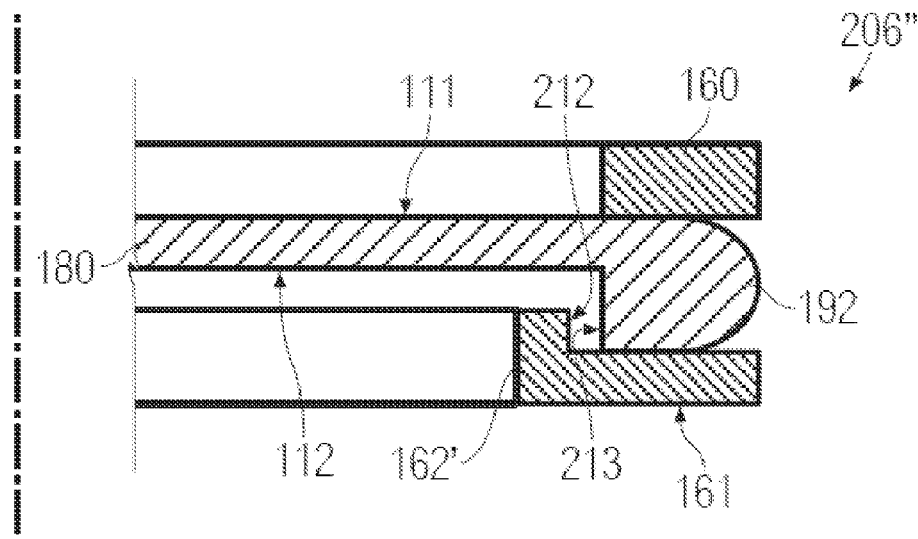
Figure 26:
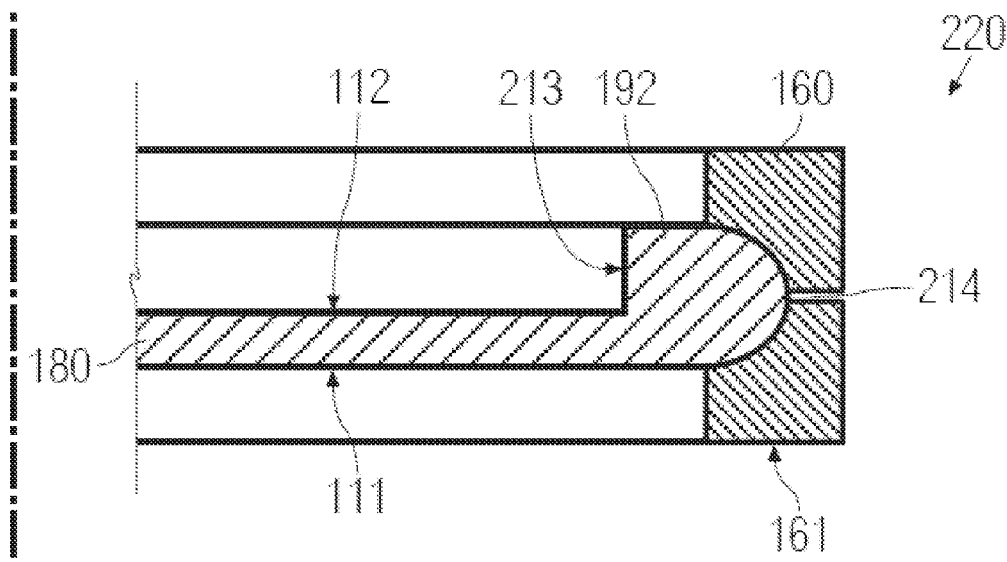
Figure 27:
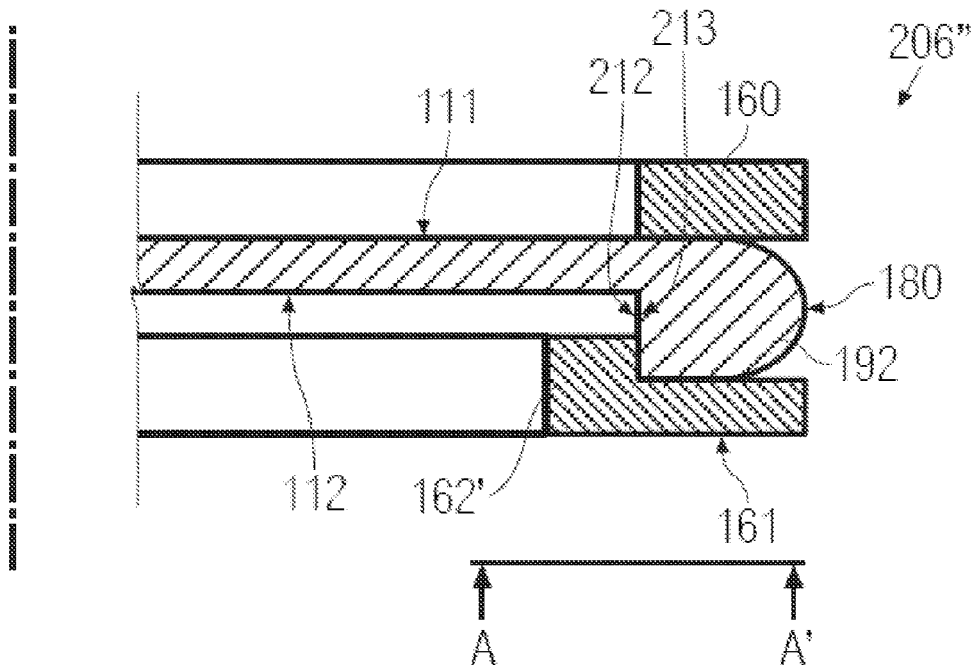
Figure 28:
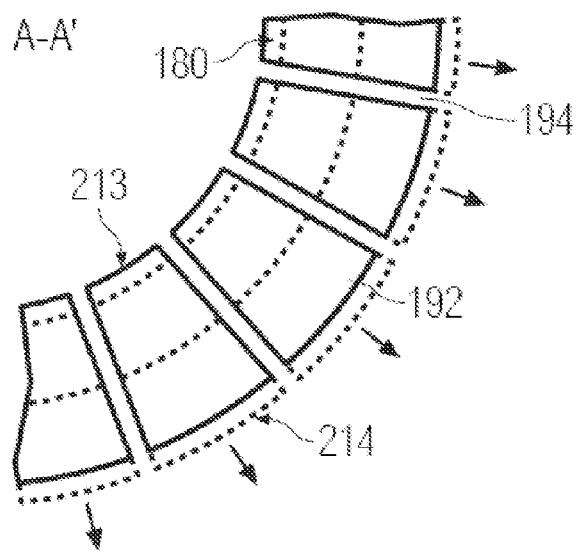
Figure 29:
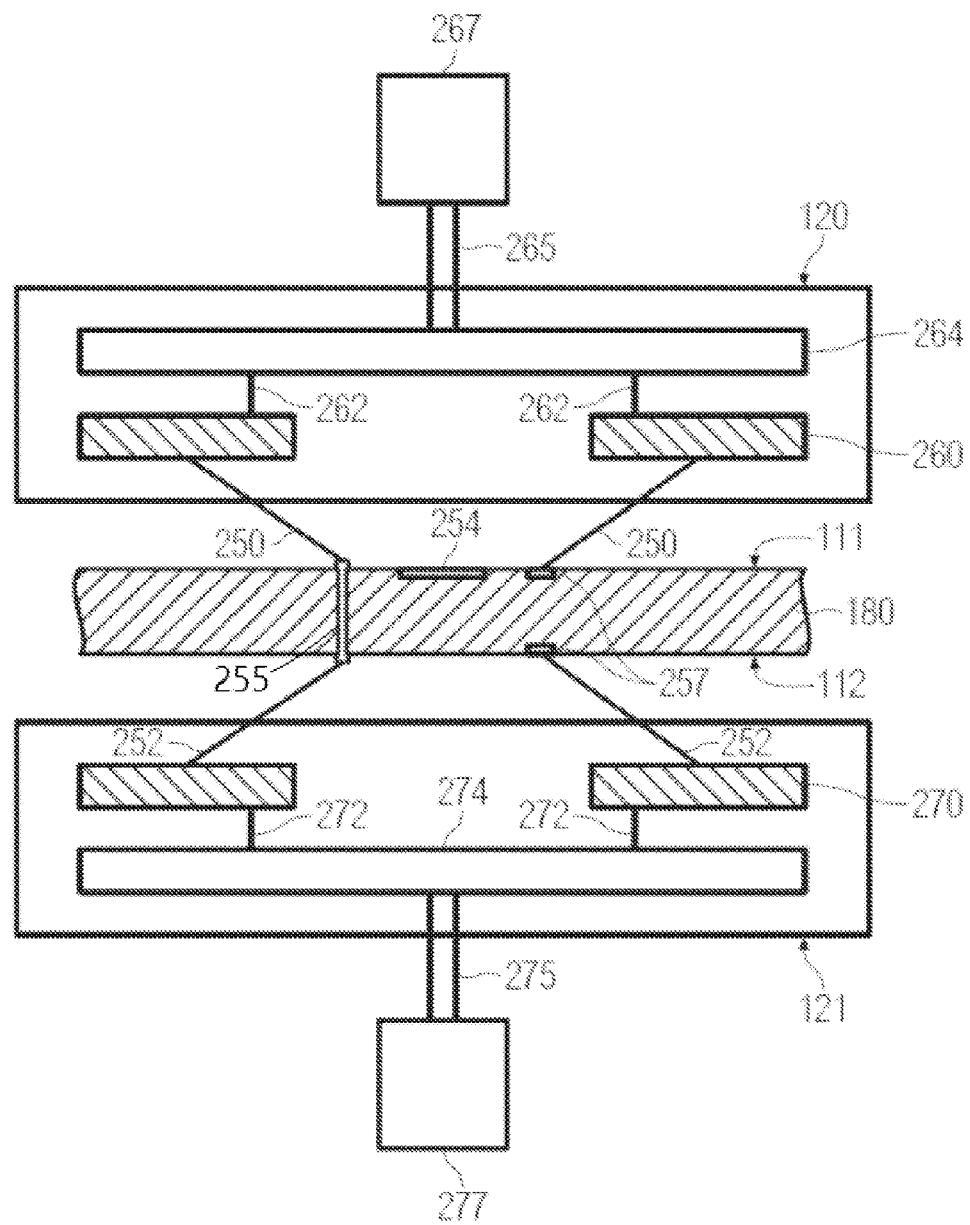
Figure 30:
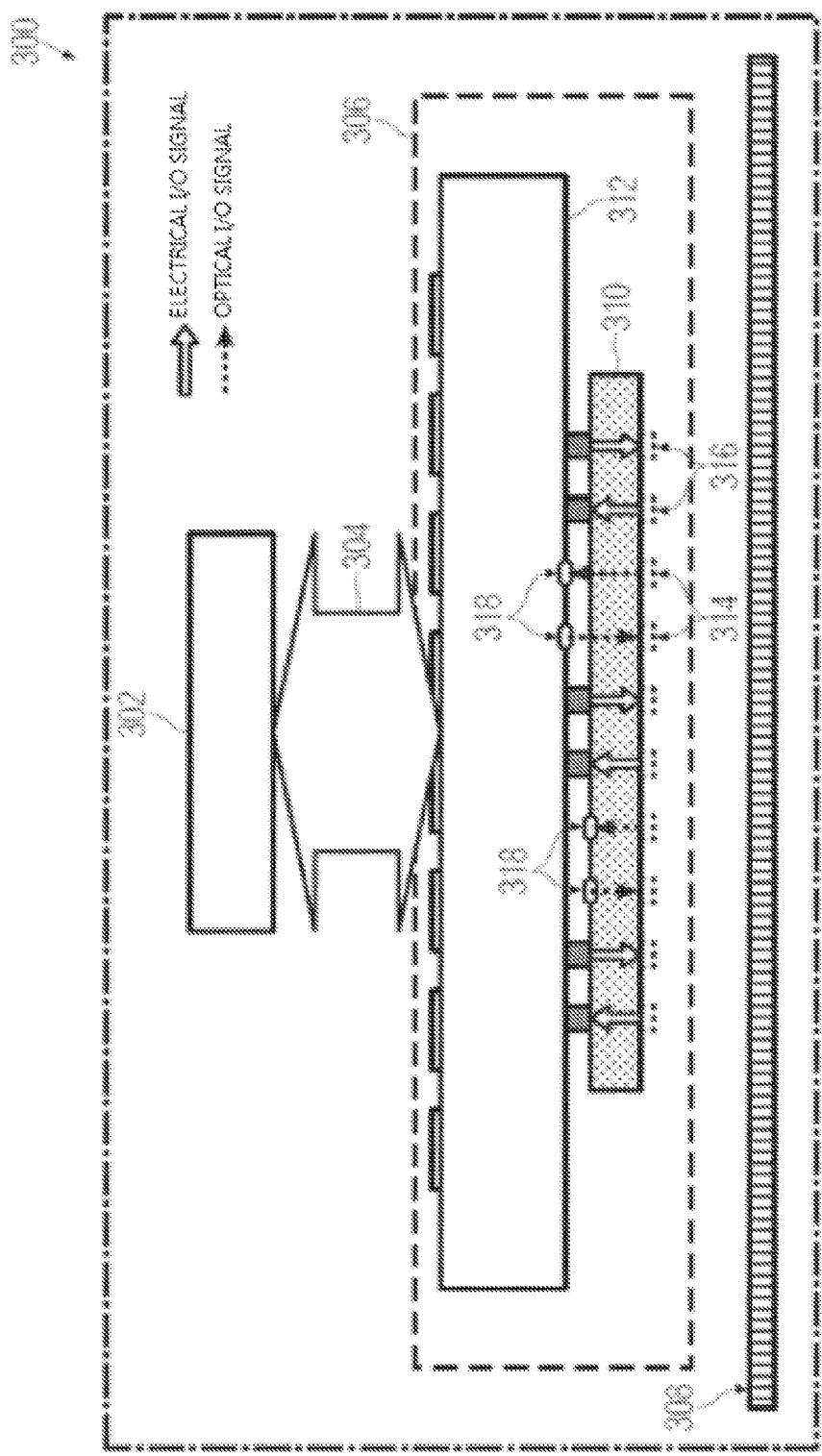
Figure 31:
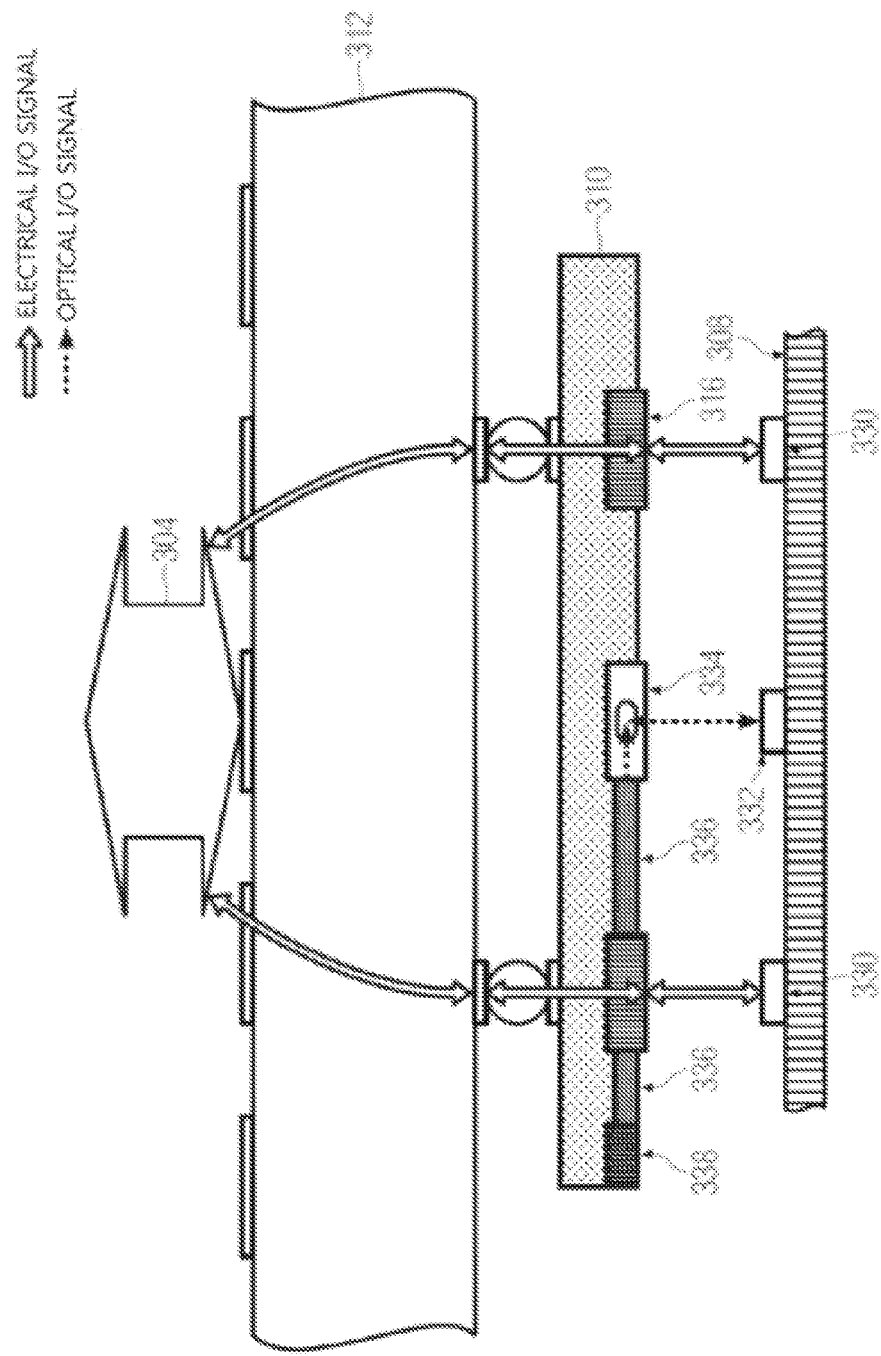
Figure 32:
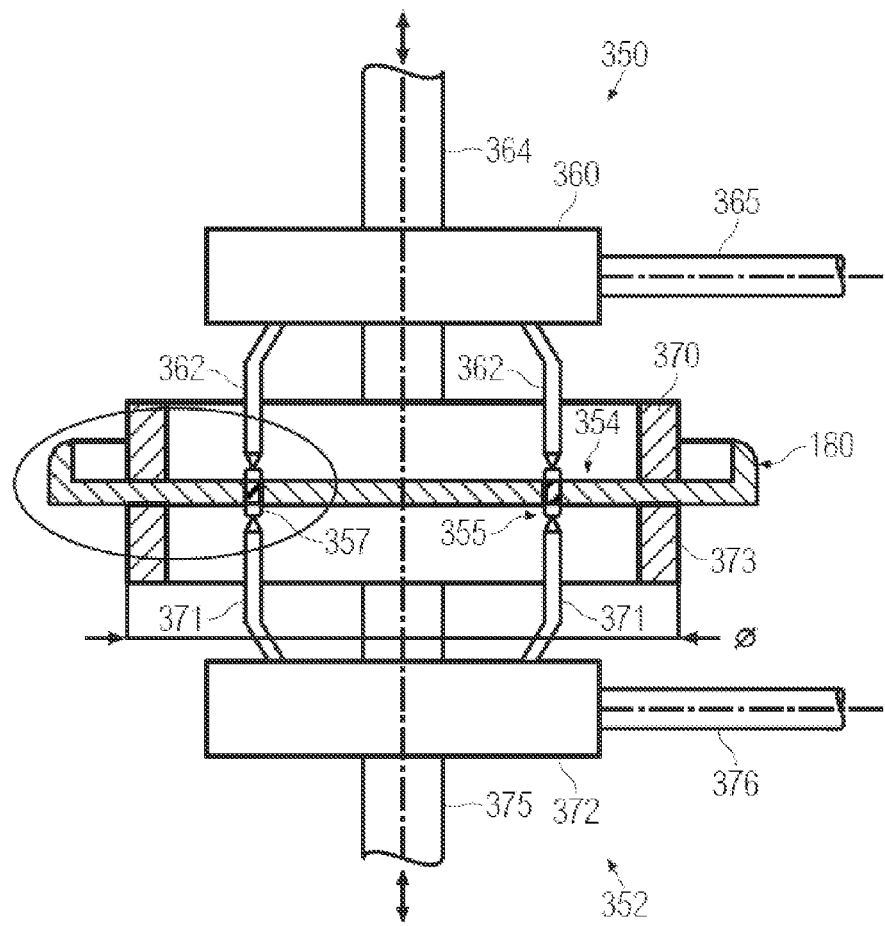
Figure 33:
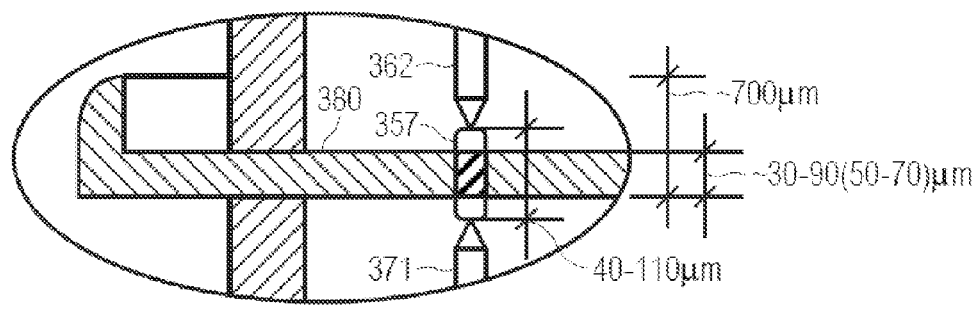

FIGS. 6 to 14 illustrate a method of fabricating and testing a semiconductor wafer comprising the method illustrated in FIG. 2.
FIG. 6 illustrates a wafer with a face comprising active structures and blind vias;
FIG. 7 illustrates the wafer of FIG. 6 with a protective tape fixed onto the face comprising the active structures and blind vias;
FIG. 8a illustrates a cross-sectionals view of the wafer of FIG. 7 after a recess has been formed in an opposing face to expose the vias,
FIG. 8b illustrates a top view of the opposing face of the wafer and illustrates slits in a peripheral region;
FIG. 9 illustrates the wafer of FIG. 8 after the deposition of a distribution structure onto the opposing face;
FIG. 10 illustrates the wafer of FIG. 9 with the protective tape removed;
FIG. 11 illustrates a method of handling the wafer of FIG. 10;
FIG. 12 illustrates clamping of the wafer of FIG. 11 in retaining means according to a first embodiment;
FIG. 13 illustrates double-sided testing of the wafer illustrated in FIG. 12;
FIG. 14 illustrates the tested wafer of FIG. 13 that is placed in a dicing frame;
FIGS. 15 to 22 illustrate steps of a comparison method of testing a wafer.
FIG. 15 illustrates a wafer with active structure and blind vias for processing by another method;
FIG. 16 illustrates electrical testing the wafer of FIG. 15;
FIG. 17 illustrates the wafer of FIG. 16 attached to a carrier;
FIG. 18 illustrates the wafer of FIG. 17 after a wafer thinning process;
FIG. 19 illustrates the wafer of FIG. 18 after the application of a distribution structure on the exposed side of the wafer;
FIG. 20 illustrates electrical testing of the wafer illustrated in FIG. 19;
FIG. 21 illustrates the wafer of FIG. 20 attached to a dicing frame;
FIG. 22 illustrates the wafer of FIG. 21 after removal of the carrier;
FIGS. 23 to 27 illustrate retaining means for a wafer with an annular protruding rim;
FIG. 23 illustrates a retainer for a wafer with an annular protruding rim according to a first embodiment;
FIG. 24 illustrates a retainer for a wafer with an annular protruding rim according to a second embodiment;
FIG. 25 illustrates a retainer for a wafer with an annular protruding rim according to a third embodiment;
FIG. 26 illustrates a retainer for the wafer with an annular protruding rim according to a fourth embodiment;
FIG. 27 illustrates a retainer for a wafer with an annular protruding rim according to a fifth embodiment;
FIG. 28 illustrates a top view of the wafer illustrated in FIG. 27;
FIG. 29 illustrates an embodiment of the double-sided testing of FIG. 13;
FIG. 30 illustrates an embodiment of testing a device that has electrical and optical functions;
FIG. 31 illustrates an embodiment of the testing of FIG. 30;
FIG. 32 illustrates a further embodiment of the doublesided testing of FIG. 13;
FIG. 33 illustrates an expanded view of a part of FIG. 32.
FIGS. 1 to 32 have similar parts. The similar parts have same names or same part numbers. The description of the similar parts is hereby incorporated by reference, where appropriate, thereby reducing repetition of text without limiting the disclosure.

FIG. 1 illustrates a semiconductor chip or die 100 comprising a front face 111 comprising active structures 115 and a rear face 112 opposing the front face 111. The semiconductor chip 110 also includes a plurality of vias 116, which extend through the thickness of the semiconductor chip 100 from the front face 111 to the rear face 112. The vias 116 are also called through silicon vias (TSV). The semiconductor chip 100 has a thickness of less than 100 μm.

FIG. 1 also illustrates three different types of contact A, B and C, which is may be desirable to test.

A indicates a point on the front face 111 of the semiconductor chip 100, for example a point on a first redistribution structure 113 on the front face 111 of the semiconductor chip 100.

B indicates a point positioned on the front face 111 of the semiconductor chip 100, for example a point on a second redistribution structure 114 on the rear face 112 of the semiconductor chip 100.

C indicates a contact to the active structures 115 of the semiconductor chip 100.

Semiconductor chips are generally fabricated as part of the semiconductor wafer including a plurality of the semiconductor chips arranged in a square grid array or rectangular grid array. After fabrication of the devices within the semiconductor chip positions, the wafer is singulated to produce a plurality of discrete semiconductor chips. The semiconductor chips may be electrically tested prior to singulation of the wafer and the assembly of the semiconductor chips into packages.

This testing on the wafer level may be used to identify and sort out defective devices, so that these so-called bad chips are not assembled at all in order to avoid costs. Thus, wafer level tests are usually done with probe cards, which test each chip of the wafer individually by placing needles over the bond pads of the chip.

By means of this wafer-level test, it is possible to sort out chips with defects. However, a full functional test at a high testing frequency which simulates the operating frequency of the chip can usually be done only after the assembly and packaging of chip. This is because the electrical contact from the needle to the bond pad may not be feasible or cannot be used to reliably test the chip at high frequency and/or voltage. Testing the chip under full operation conditions may only be feasible after the packaging.

It is desirable to obtain as much information as possible from the chips before assembly and packaging in order to avoid incurring "blind assembly costs", i.e. packaging chips which when tested after packaging are revealed to be defective. In this case, the whole package is typically discarded. This can be carried out effectively with the method and apparatus described in the following.

FIG. 2 illustrates testing methods for wafers with vias including through contacts according to the present application. The testing is performed at the wafer level.

Due to the vias and the rear side processing, an additional testing step is typically carried out compared to semiconductor chips, which do not include through contacts since the through contact is tested.

Starting point is a wafer 12 having a thickness of for example 700 um, an active IC structure 115, and blind vias 116 of for example 120 um thickness. The wafer 12 can be electrically tested in this stage at the wafer level-using probe 120. The result is information about the functionality of the IC structure 115. Of course, at this stage no information about the vias 116 can be obtained because testing of electrical contact can only be done at one side by a wafer prober 120. The yield information about the IC yield is stored electronically in a wafer map 118.

Following this, the wafer 12 is thinned at the rear side of the wafer 12, so that the via 116 is also revealed or exposed at the rear side. The wafer 12 is further processed at the rear side for rear side redistribution (RDL) or for bumping to form electrical contacts at the rear side. The wafer 12 must be tested again from this side, as at this point no information about the rear side RDL/bumping and the vias 116 is available.

Depending on the electrical characteristics of the chip, the following possible electrical paths between contact types A, B, and/or C may be tested:

i) path from A to B with no contact to the chip C. This path may be a purely passive connection from the rear side to the front side. This connection can only be measured if the testing is carried out from both sides of the wafer. This type of test may be carried out on interposers with do not include active structures and other passive applications.

ii) path from A to B with contact to the chip C. This path is closest to real life applications: Data "from below" that for processing in the chip are send "to the top" as well as in the reverse direction.

iii) path from A to A with contact to chip C tests one side of the wafer only. This test may be carried our before the rear side of the wafer is processed. The wafer may also be tested after rear side processing to determine whether there has been degradation of the chip and, in particular, of the active structures, due to rear side processing.

iv) path from A to A with no contact to the chip is relewant for testing a test structure.

v) path from B to B with no contact to the chip is similarly relevant for testing a test structure.

vi) contact from B to B with contact to the chip can test the chip including the active structures from the rear side of the wafer.

Testing from two opposing sides of the wafer 12 by two probes 120, 121 positioned adjacent opposing sides of the wafer 12 offers the highest flexibility for testing wafers with vias, as all 6 combinations can be tested, especially case ii). All of the dies of the wafer may be tested to create a wafer map 118 of good dies and bad dies.

By obtaining yield information about the vias and about the rear-side processing, defective chips from these two processes can be sorted out and not forwarded to assembly. Blind build costs can be reduced. This problem of assembling defective chips and the associated costs becomes worse if the chips are stacked in the package as the entire stack including any good chips is discarded.

A stack 130 of chips is illustrated in FIG. 3. If for example the rear-side RDL and via yield is 97% and the application consists of stacking four chips, the package yield would be, assuming no RDL/Via yield is known, only $0.97^4=88\%$ only, meaning that the package yield in this example is 9% less than it would have been feasible. Put differently, one defective chip 131 would destroy three good chips 132, 133, and 134 or cause the three good chips 132, 133, and 134 not to work properly when the defective chip 131 and the three good chips 132, 133, and 134 are stacked together for one application. Therefore, it is useful to know the rear-side and the via yield prior to assembly to increase the package yield. By this, the cumulative yield issue or loss can be reduced or even avoided.

The die or chip technical requirement for testing of TSV wafers from two sides is technically difficult to implement in thin wafers, for example wafers having a final thickness of less than 100 µm, due the reduced thickness of the wafer after rear-side processing.

If wafer support systems or electrostatic chucks are used to support the wafer during testing, the front side of the wafer is temporarily bonded to a carrier wafer 140 and the wafer is then accessible during processing only from the passive side 112 as illustrated in the comparison of FIG. 3. Only after de-bonding or unclamping the wafer, can the wafer 13 be accessed from two sides. However, at this stage the wafer 12 is thin and fragile so that any handling can be very difficult, if not impossible without damaging the wafer.

In the present application, a method and apparatus is provided that enables the testing of wafers with chips having through contacts from both sides at the wafer level, as illustrated in FIG. 4. This offers the flexibility to test all the six combinations of electrical paths listed above.

FIG. 5 illustrates a schematic diagram of components of an apparatus for the double-sided testing of wafers. The wafer may have an outer supporting structure in the form of an annular ring protruding from the rear face of the wafer at the periphery of the rear face of the wafer.

The apparatus comprises a first probe 120 positioned adjacent the rear side 112 of the wafer 12 and a second probe 121 positioned adjacent the front side 111 of the wafer 12. In this embodiment, the first probe 120 and the second probe 121 can be driven independently of the wafer and one another in x, y, and z directions.

The apparatus also includes a retaining means including a first retaining member 160 and a second retaining member 161 for retaining the wafer 12. Compressive stress is applied to the retaining members 160, 161 so as to prevent the wafer from moving. The first and second retaining members 160, 161 can also be thought of as an upper clamping fixture 160 and a lower clamping fixture 161.

The wafer 12 comprises a contact 165 on the front face 111 and a contact 166 on the rear face 112 of the wafer, through contacts 116 extending between the front face 111 and the rear face 112. The wafer 12 also comprises a protruding annular rim 192 at the outer rim in the form of an annular rim protruding from the rear face 112 at the periphery of the rear face 112.

The clamping device needs not to have a high positioning accuracy, as the first and second probes 120 and 121 may positioned by a vision system and the alignment follows some optical fiducials or alignment markers.

The first and second retaining members 160, 161 providing a wafer clamping system are dimensioned and configured so that they are in contact with only the protruding annular rim 192 so that the front face 111 and rear face 112 of the wafer 12 within the area confined by the protruding annular rim 192 is freely accessible by the first and second probes 120, 121.

Additionally, the first and second retaining members 160, 161 providing a wafer clamping system are dimensioned and configured so that the protruding annular rim 192 and the wafer 12 is subjected only to compressive stress. Brittle materials like Silicon can withstand compressive stress much better than tensile stress. If only a compressive stress is applied by the clamping system, the wafer will not be subjected to any further bending or stress and is unlikely to be damaged.

Furthermore, as the protruding annular rim 192 of the wafer 12 is in direct contact with the clamping fixture 160, 161, any minor particles or scratches to the wafer can be tolerated here, as this is "dead material" which is later removed as it does not contain any active structures or ICs.

FIGS. 6 to 13 illustrate the fabrication and testing of a semiconductor wafer 12 including vias 116 according to the present application.

A wafer 180 of standard thickness of roughly or approximately 700 um with active or electrical structures 181 and blind vias 182 on the front side 183 is illustrated in FIG. 6. Dicing lines 184 for a later step of separating the wafer 180 to form discrete semiconductors chips are also illustrated in FIG. 6.

The wafer 180 is then flipped so that the active side 183 faces downwards, as illustrated in FIG. 7. The active side 183 is attached to and protected by a tape 187, which is used for protecting the active side 183 from scratches and other damages during the later steps of processing. Suitable protective tape 187 can be obtained from suppliers, such as 3M or Nito Denko. However, in other embodiments, the protective tape 187 is omitted.

A supporting structure in the form of an annular ring is created during grinding of the rear side 185 of the wafer 180. The central portion of the rear side 185 of the wafer 180 is ground to produce a circular recess confined by the protruding annular rim 192 which acts as a supporting structure for the wafer 180 as illustrated in FIG. 8.

In an embodiment, a plurality of slits are produced in the protruding annular rim 192 of the rear side before the wafer 180 is ground, as illustrated in FIG. 8*b*. The slits 194 extend radially and have a length so that they extend from an inner face to the outer face of the protruding annular rim 192 once the protruding annular rim 192 is formed. These slits 194 provide escape pathways for liquids applied to the central recess during grinding of the rear side, since the circular grinding motion tends to push liquid radially outwards due to centrifugal force. The grinding process is continued until end of the vias 182 is exposed at the rear side of the wafer and the central region of the wafer has a thickness corresponding approximately to the desired thickness of the finished semiconductor chips.

Further structures such as a redistribution layer and/or contact pads and contact bumps are then applied to the rear side, as illustrated in FIG. 9. The rear-side structures may include RDL (Redistribution) 196 and bumping 193 to provide contact pads at the rear-side of the wafer 180. The contact pads allow electrical connection to the front side 111 and to electrical structures 181. The redistribution provides a conductive track that connects to exposed vias at the rear-side of the wafer for easier electrical connection to exposed vias. Processing used for creating the rear-side structures includes lithography, plating, PVD (Physical vapor deposition), and CVD (Chemical vapor deposition). During the processing, process liquids can leave the central recessed portion of the wafer 180 through the slits 194 provided in the protruding annular rim 192.

After the rear-side processing, which enables connections from the rear side 112 to the front side 111 of the wafer 180, is completed, the protective tape 187 is removed, as illustrated in FIG. 10. Even though the protective tape 187 is removed, the protruding annular rim can handle the wafer 180 without contacting or touching to one of its major sides. Contacting the wafer may result in scratches and/or contamination. Use of the protective tape 187 is optional.

A robot 200, as illustrated in FIG. 11 can handle the wafer 180. Further, the wafer 180 can be placed in a cassette 202 such that none of the sides or active areas is touched, as illustrated in FIG. 10.

In order to carry out electrical testing of the wafer, the wafer 180 is clamped into a chuck 206 for electrical testing, as illustrated in FIG. 12, by use of the apparatus illustrated in FIG. 5. During testing, the prober exerts a force that is not very high on the wafer 180. Therefore, the clamping force on the wafer 180 is also not very high.

The wafer 180 can be tested from two sides, as illustrated in FIG. 13.

A wafer map 205 containing test result is then created and is sent to later operation of assembly, in particular die-bonding operation, such that only good chips are selected from the wafer for assembly into packages.

After the electrical testing, the wafer 180 is released from clamp 206 and may be mounted on a dicing frame 207 with dicing tape 209, as illustrated in FIG. 14. The wafer may then be diced to singulate or to separate the individual semiconductor chips from the wafer 180 and the package assembly operation may then be performed.

FIGS. 13 to 22 illustrate a comparison method, which includes producing TSV wafers by means of a Wafer Support System attached to one entire side of the wafer. With the comparison method, it is difficult and may be impossible to test a wafer safely or properly from two sides.

FIG. 15 illustrates a frontend wafer 180, i.e. a wafer after processing the front side 111 to include active structures 115 and a metallization on the front side 111. The wafer 180 can be electrically tested from one side using standard wafer probers, as illustrated in FIG. 16. Electrical information or parameters of active structure of the wafer are obtained through testing. No information about the vias is gained, as the electrical contact pads of the vias at the rear-side of the wafer are not accessible for electrical testing. The vias have no accessible electrical path, which extends along their length. A wafer map is generated after testing.

The wafer 180 is then flipped over and is bonded to a wafer support system 210, as illustrated in FIG. 17. The wafer support system, as provided here for illustration, is in the form of a carrier wafer. Later, the rear side 112 of the wafer 180 is thinned down by grinding the rear side of the wafer to a thickness of 80 um for example, as indicated schematically by the arrows, to reveal the vias 116 at the rear-side of the wafer, as illustrated in FIG. 18.

After this, rear-side processing is done, as illustrated in FIG. 19. The rear-side processing includes fabrication of a redistribution structure (RDL) and bumping. At this stage, the wafer has stability, which is provided by the carrier wafer. It has stability in the sense that the wafer, as supported by the carrier wafer, is rigid and does not bend easily. Thus, it can be handled quite easily on standard machines. Next, redistribution (RDL) or bumping is done on the rear-side of the wafer. This step provides the wafer with electrical connections from its front side to its rear side.

The wafer 180 can then be tested by a wafer prober, but only from one side, as illustrated in FIG. 20. After this, the wafer 180 is mounted to a dicing frame 207 with a dicing tape 209, as illustrated in FIG. 21. The bumps are pressed into the elastic dicing tape 209. Following this, the carrier wafer and the adhesive is removed from the wafer, as illustrated in FIG. 22. The wafer 180 can now be diced or sawn to separate the wafer into multiple semiconductor chips 100. The testing of wafer from both sides simultaneously is not performed since one of the sides is covered up by a carrier.

According to the present application, the wafer may be clamped in many ways as long as both sides are accessible for testing. FIGS. 23 to 27 illustrate a wafer support structure according to five different embodiments. The wafer support structure can be used when testing the wafer with the apparatus illustrated in FIG. 5.

The wafer support structure 206 comprises a first retaining member 160, and a second retaining member 161. The first retaining member 160 and second retaining member 161 mutually cooperate to retain the semiconductor wafer 180 in place during testing. The first retaining member 160 comprises a first annular ring, which is generally planar.

FIG. 23 illustrates a wafer support structure 206 in which the first retaining member 160 comprises a first annular ring and the second retaining member 161 comprises a second annular ring with a protruding peripheral rim 162. The second annular ring has an L-shaped cross-section. The second annular ring is dimensioned so that an outer face 214 of the protruding annular rim 192 of the semiconductor wafer 180 is accommodated within the inner face 212 of the protruding peripheral rim 162 of the second retaining member 161. The rear side 112 of the wafer 180 faces towards the second retaining member 161.

In the embodiment illustrated in FIG. 23, the outer surface 214 of the protruding annular rim 192 of the wafer 180 is supported on, and is retained by the L-shaped second annular ring 161. The first annular ring 160 is positioned on the front side 111 of the wafer 180 so that it makes contact with the front side 111 only in the peripheral region, which does not include dies and active structures.

FIG. 24 illustrates a second embodiment of a wafer support structure 206' in which the arrangement of the two retaining members 160, 161 is reversed with respect to the wafer 180. In the second embodiment, the second annular ring 161 with an L-shaped cross-section is positioned on the front side 111 of the wafer 180 and the first annular ring 160 having a rectangular cross-section is positioned on the rear side 112 of the wafer 180. The first annular ring 160 makes contact with the wafer 180 only on the outer surface of the protruding annular rim 192.

FIG. 25 illustrates a third embodiment of a wafer support structure 206" comprising a first annular ring 160 having a planar form as in the first two embodiments. In the third embodiment, the second annular ring 161 comprises a rim 162' protruding from an inner region of the ring. The outer face 212 of the protruding rim 162' of the second retaining member 161 is dimensioned to be accommodated within an inner face 213 of the protruding annular rim 192 of the semiconductor wafer 180. The second annular ring 161 has an L-shaped cross-section with the upright portion of the L being positioned towards the centre. In this embodiment, the outermost surface of the protruding rim portion 192 of the wafer 180 is supported on the peripheral regions of the second annular ring 161. The upright portion of the L-shaped cross-section may contact the rear side 112 of the wafer 180 or may be dimensioned to be spaced at a distance from the rear side 112 of the wafer 180.

FIG. 26 illustrates a wafer support structure 220 according to a fourth embodiment in which both the first and second retaining members 160, 161 comprise an annular ring with an L-shaped cross-section. In this embodiment, the upright part of the L of both the first and second retaining members 160, 161 is positioned adjacent the outer face 214 of the protruding annular rim 192 of the wafer 180. This embodiment may be used to control the lateral position of the wafer 180 more easily than may be achievable by the wafer support structures of the first three embodiments.

The first and second retaining members 160, 161 of the fourth embodiment have a curved form to the inner surface of the L-shaped cross-section, which is adapted to the curved form of the outermost surface 214 of the wafer 180. This improves the fit of the wafer 180 within the support structure 220 so as to more closely define the lateral position of the wafer 180 within the wafer support structure 220.

The first annular ring 160 may be dimensioned to align with the protruding annular rim 192 of the semiconductor wafer 180. The inner diameter of the first annular ring 160 and the outer diameter of the first annular ring 160 are approximately the same as the inner diameter and outer diameter of the protruding annular rim 192.

The second annular ring 161 may also be dimensioned to align with the protruding annular rim 192 of the semiconductor wafer 180. The inner diameter of the second annular ring 161 and the outer diameter of the second annular ring 161 are approximately the same as the inner diameter and outer diameter of the protruding annular rim 192.

FIG. 27 illustrates a wafer support structure according to a fifth embodiment. In the fifth embodiment, the wafer support structure 206" has a form similar to that of the third embodiment but differs from the third embodiment in the fit of the outer diameter 212 of the upright portion of the L-shaped cross-section and the inner diameter 213 of the protruding annular ring 192 of the wafer 180. In this embodiment, the outer diameter 212 of the upright portion of the L-shaped cross-section and the inner diameter 213 of the protruding annular ring 192 of the wafer 180 match more closely so as to more closely define the lateral position of the wafer.

FIG. 28 illustrates a top view of the wafer 180 of FIG. 27. The clamp allows the wafer to be held to compensate from any warp or other types of bending. The clamp of FIG. 27 allows pressure to be placed in inner part of the wafer.

The method of testing a wafer according to one of the previous embodiments may be carried out at one or more different stages during production of the wafer.

In an embodiment, the wafer is tested the wafer has a thickness of 700 um after front end processing to form the IC's. Information about the IC itself is then obtained.

The wafer may then be further processed for thinning and for rear-side processing to create contact pads on both sides of the wafer for later TSV applications. The wafer may then tested from both sides to determine if the through contacts have the desired electrical characteristics.

The wafer can be tested from only the active side after rear side processing. By doing so, the IC is tested a second time. If the results from the first test, carried out before rear side processing, and the second test, carried out after rear side processing, are compared, it is possible to derive information on the impact of the rear-side processing, such as impact of mechanical stress from back-grinding, thermal effects, etc. on the IC's. This allows optimization of rear-side processes in order to minimize their impact on the IC.

FIG. 29 shows an embodiment of the double-sided testing of FIG. 13.

FIG. 29 shows a first probe 120 electrically testing a front side 111 of a wafer 180 and a second probe 121 electrically testing a rear side 112 of the wafer 180.

The first probe 120 contacts the wafer 180 through a plurality of probe needles 250 whilst the second probe 121 contacts the wafer 180 through a plurality of probe needies 252.

The wafer 180 includes an active structure 254 that is electrically connected to a plurality of vias 255 and to a plurality of contact pads 257 through conductive tracks. The conductive tracks are not shown in the FIG. 29. The active structure 254 is provided on the front side of the wafer 180. The vias 255 extend from the front side 111 to the rear side 112 of the wafer 180. The contact pads 257 are positioned on the front side 111 and on the rear side 112 of the wafer 180. The contact pad 257 can be connected to the active structure 254 through the via 255.

The first probe 120 includes a probe card 260. One side of the probe card 260 is attached to the probe needles 250 that contacts the vias 255 and the contact pads 257 of the active structure 254. Another side of the probe card 260 contacts a plurality of pogo pins 262 that are attached to an electrical testing load board 264. A plurality of wires 264 connects the load board 264 to an electrical automatic testing equipment (ATE) 267.

Similarly, the second probe 121 includes a probe card 270. One side of the probe card 270 is attached to the probe needles 252 that contact the vias 255 and the contact pads 257 of the active structure 254. Another side of the probe card 270 contacts a plurality of pogo pins 272 that are attached to an electrical testing load board 274. A plurality of wires 274 connects the load board 274 to an Automatic Testing Equipment (ATE) 277.

In a testing position, probe tips of the probe needles 250 contacts the wafer 180 whilst the probe tips of the probe needles 252 contacts the wafer 180. The probe tips of the probe needles 250 can be separated from the probe tips of the probe needles 252 by a distance of about 60 micrometers or more. In special cases, this distance can be less than 60 micrometers for testing very thin wafers. Put differently, ends of the probe needles 250 and ends of the probe needles 252 can be separated by a distance of about 60 micrometers. In this case, the thickness of the wafer 180 can be a bit thinner than 60 micrometers.

The probe needle ends or tips can be separated from each other by a distance of more than about 65 micrometers when the contact pads 257 or the vias 255 are arranged in a line.

Further, the separation distance can be less than about 65 micrometers when the contacts 257 or the vias 255 are arranged in a staggered manner. The separation distance is measured in a plane that is parallel to the longitudinal plane of the wafer 180.

Functionally, the active structure 254 provides electrical functions. The active structure 254 receives electrical input or energy from external sources and generates electrical output signals through the vias 255 or the contact pads 257. In a special case, the active structure 254 receives also optical signals.

Referring to the front side 111, the active structure 254 receives and provides electrical signals through the vias 255 and the contact pads 257, through the probe needles 250, through the probe card 260, through the pogo pins 262, through the testing load board 264, through the wires 264, and to the ATE 267.

Referring to the rear side 112, the active structure 254 receives and provides electrical signals through the vias 255 and the contact pads 257, through the probe needles 252, through the probe card 270, through the pogo pins 272, through the testing load board 274, through the wires 274, and to the ATE 277.

The ATE 267 and 277 send electrical signals to the active structure 254 and compare received electrical signals from the active structure 254 for testing electrical functionalities or electrical parameters of the active structure 254.

FIG. 30 shows an embodiment of testing a device that has electrical and optical devices. FIG. 30 shows a setup 300 of an automated test system for testing a device (DUT) that has optical and electrical functions.

The set-up 300 includes an automatic-test-equipment (ATE) 302, an ATE connection interface 304, a probe module 306, and a device under test (DUT) 308.

The probe module 306 includes a probe substrate 310 and a redistribution substrate 312 that is interfaced or is connected electrically and optically to the probe substrate 310.

The probe substrate 310 has electrical probes 316 and conductive tracks for connecting electrically with the DUT 308 as well as optical probes 314 and optical elements 318 for connecting optically with the DUT 308. The conductive tracks are not shown in the FIG. 30. The electrical probes 316 can include probe needles. The optical elements or probes can include diffractive elements, reflective elements, waveguide interconnections, photodetector, or light source, such as laser and light emitting diode.

The redistribution substrate 312 has conductive tracks for routing electrical signals and optical elements for routing optical signals. These conductive tracks and optical elements are not shown in the FIG. 30 for simplicity.

The ATE connection interface 304 includes electrical wires and optical fibers or fiber optic ribbon, which are not shown in the FIG. 30 for simplicity.

Functionally, the probe module 310 acquires from electrical and optical signals the DUT 308, sends electrical and optical signals to the DUT 308 via the probe module 310. The redistribution substrate 312 redistributes these signals to the ATE 302 through the ATE connection interface 304.

The electrical probes 316 are used for physically contacting with contact pads of the DUT to allow transmission and reception of electrical signals. The electrical probes 316 can have a large number of probe-to-pad touchdowns while maintaining a low contact resistance of less than a few ohms. Similarly, the optical probes 314 and the optical elements 318 route optical signals to and from the DUT 308.

The ATE connection 302 transmits electrical signals via the electrical wires and optical signals via the optical fiber between the DUT 308 and the ATE 302.

In a generic sense, the probe module 310 can be scaled to allow testing of a single connection or multiple connections in parallel. Similarly, the probe module 310 can be used for testing one device or multiple devices in parallel.

FIG. 31 shows an embodiment of the testing of FIG. 30. FIG. 31 includes parts of the FIG. 30. A device under test (DUT) 308 is connected electrically and optically to a probe substrate 310.

The DUT 308 has electrical ports 330 and an optical port 332. The probe substrate 310 has electrical probes 316 for electrically connecting to the electrical ports 330 and optical probe 334 for optically connecting to the optical port 332.

The optical probe 334 is positioned directly above the optical port 332 and it is connected to waveguide connections 336 that are connected to optical source or receiver 338.

Functionally, the optical probe 334 receives optical signals from the optical source 338 or sends optical signals to the optical receiver 338 via the waveguide connections 336. The optical probe 334 has an optical element for sending optical signals to the optical port 332 and for receiving optical signals from the optical port 332.

FIG. 32 shows a further embodiment of the double-sided testing of FIG. 13. FIG. 32 depicts a first probe 350 and a second probe 352 clamping and contacting a wafer 180 in a testing position.

The wafer 180 has a top side 354 and a rear side 355. The first probe 350 is positioned at the top side 354 whilst the second probe 352 is positioned at the rear side 355.

The wafer 180 includes active structures and a plurality of vias 357 for connecting to the active structures. The active structures are not shown in the FIG. 32 for simplicity. The vias 357 extends from the top side 354 to the rear side 355 of the wafer 180.

The thickness of the thinned part of the wafer 180, as shown in FIG. 32, is about 30 to 90 micrometers. In certain cases, the thickness can be about 50 to 70 micrometers. With special techniques, such as chemical etching, this thickness can be reduced further to about 15 micrometers. The height of the rim of the wafer 180 is about 700 micrometers, which is the standard thickness of most semiconductor wafers.

The first probe 350 includes a first prober 360 with a plurality of probe needles 362. Tips or ends of the probe needles 362 contact or touch the vias 357 at the top side 354 of the wafer 180. The first prober 360 also comprises a first wafer-clamping rim 370 that contacts the top side 354 of the wafer 180. The first clamping rim 370 surrounds the vias 357 and the active structure that is being tested as well as the probe tips.

Further, the first prober 360 has a wafer clamp actuation arm 364 that is connected with the first clamping rim 370 at a top of the first prober 360 and a test head actuation arm 365 that is provided at a side of the first prober 360.

Similarly, the second probe 352 includes a second prober 372 with a plurality of probe needles 371. Tips or ends of the probe needles 371 contact the vias 357 at the rear side 355 of the wafer 180. The second prober 372 further comprises a second wafer-clamping rim 373 that contacts the rear side 355 of the wafer 180. The clamping rim 373 also surrounds the vias 357 and the said probe tips.

Moreover, the second prober 372 has a wafer clampactuation arm 375 that is connected with the second clamping rim 373 at a bottom of the second prober 372 and a test head actuation arm 376 that is provided at a side of the second prober 372.

In the testing position, the probe tips of the upper probe needles 362 and the probe tips of the lower prober needles 371 touch the wafer 180 and they are separated by a distance of about 40 to 110 micrometers. This distance can also be more or less when the thickness of the wafer 180 is thicker or thinner. The diameter of the clamping rims 370 and 373 is about a few millimeters to a few centimeters.

In a generic sense, contact pads can replace the vias 357 for providing contact terminals to the active structure.

Functionally, the first prober 360 and the second prober 372 are used for routing electrical signals between an ATE and the active structure via the probe needles 362 and 371.

The clamp actuation arms 364 and 375 move the clamping rims 370 and 373 respectively towards or away from the wafer 180. The clamping rims 370 and 373 can move toward the wafer 180 and can clamp a part of the wafer 180 for electrical testing. The clamping enables the wafer part to be essentially rigid or flat during testing.

This clamping has the benefits of allowing easier alignment between the probe tips and the vias 357. The clamping enables a part of the wafer 180 that is undergoing testing to be flat for easier alignment and contact for electrical testing. The clamping rims 370 and 373 comprise a metal, such as steel or other material such they do not leave any scratch marks on the surfaces of the wafer 180 during the clamping of the wafer 180. In certain situations, the clamping rims 370 and 373 can include a resilient rim in order not to leave any scratch marks.

The test head actuation arms 365 and 376 moves the prober 360 and 372 respectively towards or away from the wafer 180. This action also moves the probe needles 362 and 371 toward or away from the wafer 180. The movement can allow the probe needles 362 and 371 to contact the wafer 180 for electrical testing.

One possible method of testing the wafer 180 includes the step of positioning the wafer 180 between the probers 360 and 372 that are separated by a distance.

The separation allows the wafer 180 to be positioned between the probers 360 and 372. The wafer 180 is positioned such that vias or contact pads of one or more active structure of the wafer 180 are placed below the probe needles 362 and above the probe needles 371.

After this, the actuation arms 364 and 375 move the clamping rims 370 and 373 toward the wafer 180 to clamp the part of the wafer that includes the active structure for testing. The clamping cause the said part to be essentially flat and rigid for easier alignment between the vias or contact pads and the probe needles 362 and 371.

The test head actuation arms 365 and 376 then moves the probe needles 362 and 371 toward the wafer 180 to contact the vias or contact pads of the active structure for testing. An ATE (Automatic Testing Equipment), which is not shown in the FIG. 33, later transmits electrical signal to the active structure via the probe needles 362 and 371 to test the active structure.

After testing, the probe needles 362 and 371 as well as the clamping rims 370 and 373 are moved away from the wafer 180. This allows the wafer 180 to be shifted. The wafer 180 is then shifted such that another active structure is positioned for testing. The above steps are later repeated to test this active structure. By this repeated these steps, all-active structures of the wafer 180 can be testing.

In a generic sense, the testing can also be done with the wafer 180 kept stationary whilst both probes 350 and 352 shift or move relative to the wafer 180 to position for testing the active structures. Alternatively, the testing can also be done with both probes 350 and 352 being kept stationary whilst the wafer 180 or shifts or moves relative to probes 350 and 352.

The invention claimed is:

1. Method for testing a semiconductor wafer, comprising:
   providing a semiconductor wafer comprising a protruding annular rim, a first redistribution structure disposed on the front side of the semiconductor wafer, a second redistribution structure disposed on the rear side of the semiconductor wafer within the protruding annular rim and a plurality of vias extending from the front side to the rear side;
   retaining the protruding annular rim between a first retaining member and a second retaining member, the first retaining member having an annular ring, the first and second retaining members being mutually co-operable to retain the protruding annular rim;
   applying compressive force to the first and second retaining members to prevent the semiconductor wafer from moving;
   contacting a first probe to the first redistribution structure on the front side; and
   contacting a second probe to the second redistribution structure on the rear side;
   wherein the first probe is in contact with the first redistribution structure and the second probe is in contact with the second redistribution structure at the same time.

2. Method according claim 1, further comprising activating a signal source to apply or receive electrical energy via the first probe to and/or from the first redistribution structure.

3. Method according to claim 1, further comprising activating a signal source to apply electrical energy via the first probe to the first redistribution structure and determining if the electrical energy is transferred to the second redistribution structure via the second probe contacting the second redistribution structure.

4. Method according to claim 1, further comprising:
   applying the first probe to a bond pad of the first redistribution structure that is associated with an electrically conductive via extending from the front side to the rear side of the semiconductor wafer;
   applying the second probe to a bond pad of the second redistribution structure that is associated with the same electrically conductive via; and
   applying an electrical signal to one or more of the bond pads to determine the characteristics of the electrical path between the bond pads.

5. Method according to claim 1, further comprising activating a signal source to apply or receive electromagnetic energy via the first probe to and/or from the first redistribution structure.

6. Method according to claim 1, further comprising activating a signal source to apply or receive electromagnetic energy via the second probe to and/or from the second redistribution structure.

7. Method according to claim 1, further comprising activating a signal source to apply a electromagnetic energy via the first probe to the first redistribution structure and determining if the electromagnetic energy is transferred to the second redistribution structure via the second probe contacting the second redistribution structure.

8. Method according to claim 1, wherein at least a part of the second probe is positioned within the protruding annular rim of the wafer whilst contacting the second redistribution structure.

9. Method according to claim 1, further comprising:
   moving the semiconductor wafer relative to the first probe and relative to the second probe the width of a die configured on the semiconductor wafer from the die to each of all neighbouring dies across the entire wafer in a step and repeat fashion only during an interim between contacting the first probe to the redistribution structure on the front side, and contacting a second probe to the redistribution structure on the rear side, whilst the first probe is in contact with the first redistribution structure on the front side.

10. Method according to claim 1, further comprising:
    moving the first probe and moving the second probe relative to the semiconductor wafer the width of a die configured on the wafer from the die to each of all neighbouring dies across the entire wafer in a step and repeat fashion only during an interim between contacting the first probe to the redistribution structure on the front side and contacting a second probe to the redistribution structure on the rear side whilst the first probe is in contact with the first redistribution structure on the front side.

11. Method according to claim 1, further comprising: clamping a portion of the wafer that comprises the first redistribution structure on the front side and the second redistribution structure on the rear side such that the portion is essentially rigid.

12. Apparatus for testing a semiconductor wafer having a protruding annular rim, a first major surface, and a second major surface opposing the first major surface, comprising:
    a first probe positionable adjacent to the first major surface;
    a second probe positionable adjacent to the second major surface;
    the first probe and the second probe being movable in x, y and z directions with respect to the wafer or the wafer being movable in x, y and z directions with respect to the first probe and the second probe;
    a first retaining member including a first annular ring;
    a second retaining member, the first and second retaining members being mutually co-operable under compression to retain the protruding annular rim;
    at least one electrical signal source for applying an electrical signal to the first major surface and/or second major surface of the semiconductor wafer; and
    at least one electrical signal measurement device.

13. Apparatus according to claim 12, wherein:
the first probe comprises a first plurality of probe needles for sending and/or receiving electrical test signals; and
the second probe comprises a second plurality of probe needles for sending and/or receiving electrical test signals.

14. Apparatus according to claim 12, wherein the first annular ring is dimensioned to align with the protruding annular rim of the semiconductor wafer.

15. Apparatus according to claim 12, wherein the second retaining member comprises a second annular ring with a protruding peripheral rim, the second annular ring being dimensioned so that an outer face of the protruding annular rim of the semiconductor wafer is accommodated within the protruding peripheral rim of the second annular ring.

16. Apparatus according to claim 12, wherein the first annular ring further comprises a protruding peripheral rim, the first annular ring being dimensioned so that an outer face of the protruding annular rim of the semiconductor wafer is accommodated within the protruding peripheral rim of the first annular ring.

17. Apparatus according to claim 12, wherein the second annular ring comprises a support rim protruding from an inner region of the ring, the outer face of the support rim of the second annular ring being dimensioned to be accommodated within an inner face of the protruding annular rim of the semiconductor wafer.

18. Apparatus according to claim 12, further comprising means to exert compressive stress on the semiconductor wafer by means of the first retaining member and the second retaining member, the first retaining member and the second retaining member being positioned on opposing sides of the semiconductor wafer.

19. Apparatus according to claim 18, wherein:
the first probe comprises a first clamping rim, the first clamping rim surrounding tips of the first plurality of probe needles;
the second probe comprises a second clamping rim that is opposite the first clamping rim, the second clamping rim surrounding tips of the second plurality of probe needles and
the first clamping rim and second clamping rim are operable for clamping a portion of the semiconductor such that the portion is essentially rigid for testing.

20. Use of the apparatus of claim 18 to test a semiconductor wafer comprising:
a first redistribution structure disposed on the front side of the semiconductor wafer;
a second redistribution structure disposed on the rear side of the semiconductor wafer within the protruding annular rim; and
a plurality of vias extending from the front side to the rear side.

* * * * *